(12) United States Patent
Choi et al.

(10) Patent No.: US 9,406,579 B2
(45) Date of Patent: *Aug. 2, 2016

(54) SEMICONDUCTOR DEVICE AND METHOD OF CONTROLLING WARPAGE IN SEMICONDUCTOR PACKAGE

(75) Inventors: DaeSik Choi, Seoul (KR); JoungIn Yang, Seoul (KR); Sang Mi Park, Kyounggi-do (KR); WonIl Kwon, Seoul (KR); YiSu Park, Kyoungki-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 29 days.

This patent is subject to a terminal disclaimer.

(21) Appl. No.: 13/471,314

(22) Filed: May 14, 2012

(65) Prior Publication Data

US 2013/0300004 A1    Nov. 14, 2013

(51) Int. Cl.
*H01L 23/31* (2006.01)
*H01L 21/56* (2006.01)
(Continued)

(52) U.S. Cl.
CPC .......... *H01L 23/3121* (2013.01); *H01L 21/563* (2013.01); *H01L 23/3128* (2013.01); *H01L 24/97* (2013.01); *H01L 23/367* (2013.01); *H01L 23/42* (2013.01); *H01L 2224/16225* (2013.01); *H01L 2224/16227* (2013.01); *H01L 2224/32225* (2013.01); *H01L 2224/48091* (2013.01); *H01L 2224/73204* (2013.01); *H01L 2224/73253* (2013.01); *H01L 2224/73265* (2013.01); *H01L 2224/81191* (2013.01); *H01L 2224/92125* (2013.01); *H01L 2224/97* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/351* (2013.01)

(58) Field of Classification Search
CPC ................. H01L 2023/4043; H01L 2023/405; H01L 24/97; H01L 21/563; H01L 23/3128; H01L 23/3121
USPC ................. 257/796, 737, 778, 659, 690, 706, 257/E23.08, E21.499, 717, E21.502, 783; 438/118, 122, 124, 126, 108, 109, 106
See application file for complete search history.

(56) References Cited

U.S. PATENT DOCUMENTS 6,459,144 B1    10/2002  Pu et al.
7,388,284 B1 *   6/2008  Zhang ........................... 257/704
(Continued)

*Primary Examiner* — Jarrett Stark
*Assistant Examiner* — Bitew Dinke
(74) *Attorney, Agent, or Firm* — Robert D. Atkins; Patent Law Group: Atkins and Associates, P.C.

(57) ABSTRACT

A semiconductor device has a substrate. An insulating layer is formed over a surface of the substrate. A semiconductor die is mounted over the surface of the substrate. A channel is formed in the insulating layer around the semiconductor die. An underfill material is deposited between the semiconductor die and the substrate and in the channel. A heat spreader is mounted over the semiconductor die with the heat spreader thermally connected to the substrate. A thermal interface material is formed over the semiconductor die. The underfill material is deposited between the semiconductor die and the substrate along a first edge of the semiconductor die and along a second edge of the semiconductor die opposite the first edge. The channel extends partially through the insulating layer formed over the substrate with the insulating layer maintaining coverage over the substrate within a footprint of the channel.

27 Claims, 26 Drawing Sheets

(51) Int. Cl.
*H01L 23/00* (2006.01)
*H01L 23/367* (2006.01)
*H01L 23/42* (2006.01)

(56) References Cited

U.S. PATENT DOCUMENTS

| | | | |
|---|---|---|---|
| 7,429,501 B1 * | 9/2008 | Wu et al. | 438/121 |
| 7,855,100 B2 * | 12/2010 | Shim et al. | 438/107 |
| 8,089,148 B1 * | 1/2012 | Lee et al. | 257/734 |
| 8,115,304 B1 * | 2/2012 | Joshi et al. | 257/724 |
| 8,228,682 B1 * | 7/2012 | Zohni et al. | 361/782 |
| 8,263,435 B2 * | 9/2012 | Choi et al. | 438/109 |
| 8,362,609 B1 * | 1/2013 | Dosdos et al. | 257/730 |
| 8,399,300 B2 * | 3/2013 | Lee et al. | 438/118 |
| 8,476,115 B2 * | 7/2013 | Choi et al. | 438/118 |
| 8,946,886 B1 * | 2/2015 | Fuentes et al. | 257/706 |
| 2002/0028533 A1 * | 3/2002 | Tang | H01L 21/563 438/106 |
| 2002/0121705 A1 | 9/2002 | Pu et al. | |
| 2006/0046352 A1 * | 3/2006 | Low et al. | 438/127 |
| 2006/0060952 A1 * | 3/2006 | Yuan et al. | 257/675 |
| 2007/0040267 A1 * | 2/2007 | Zhao et al. | 257/706 |
| 2008/0042263 A1 | 2/2008 | Wang et al. | |
| 2008/0211111 A1 * | 9/2008 | Park et al. | 257/778 |
| 2009/0121334 A1 * | 5/2009 | Oi et al. | 257/678 |
| 2009/0269890 A1 * | 10/2009 | Shimanuki | 438/124 |
| 2010/0019379 A1 * | 1/2010 | Zhao et al. | 257/713 |
| 2010/0142155 A1 * | 6/2010 | Mertol | 361/719 |
| 2010/0244236 A1 * | 9/2010 | Yun et al. | 257/713 |
| 2011/0156235 A1 | 6/2011 | Yuan | |
| 2011/0286191 A1 * | 11/2011 | Kim et al. | 361/783 |
| 2011/0316162 A1 * | 12/2011 | Ko et al. | 257/773 |
| 2011/0316170 A1 * | 12/2011 | Muramatsu et al. | 257/774 |
| 2013/0026655 A1 * | 1/2013 | Lee et al. | 257/777 |
| 2013/0049188 A1 * | 2/2013 | Choi et al. | 257/717 |
| 2013/0056862 A1 * | 3/2013 | Kim et al. | 257/692 |
| 2013/0105963 A1 * | 5/2013 | Choi et al. | 257/706 |

* cited by examiner

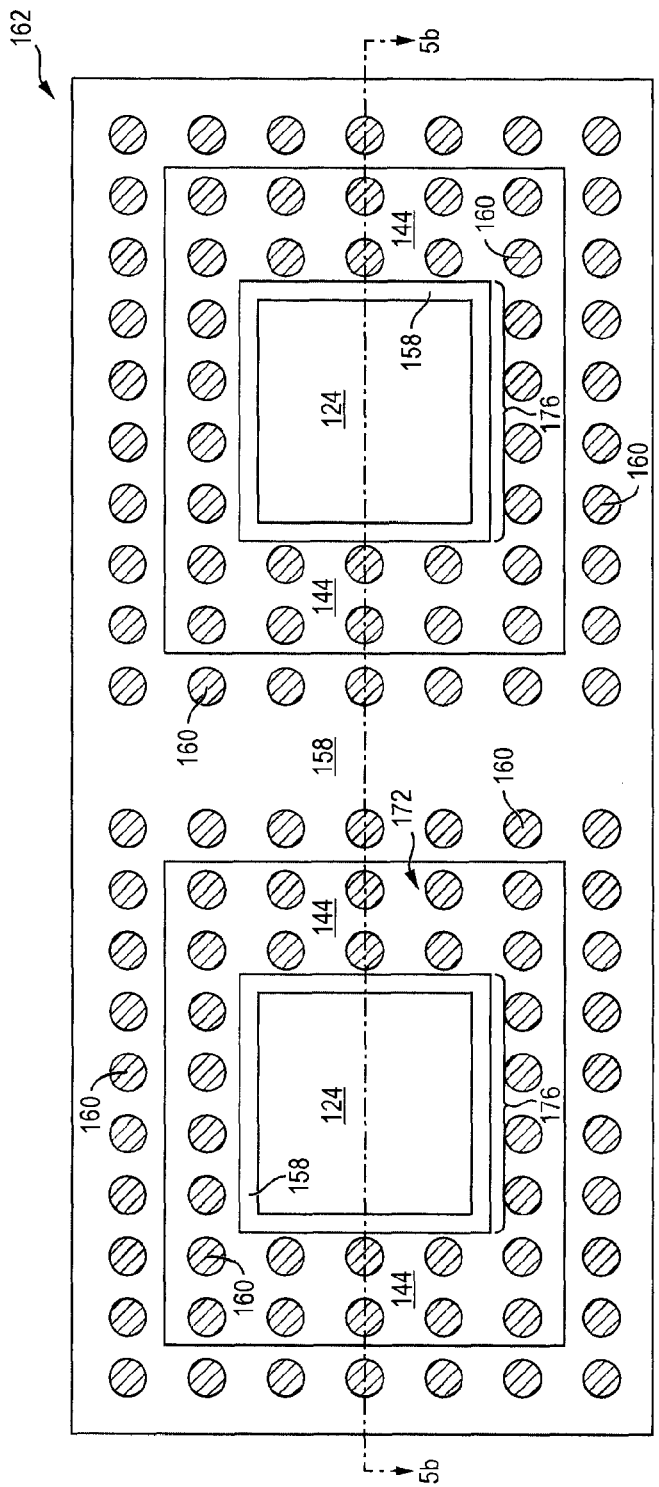
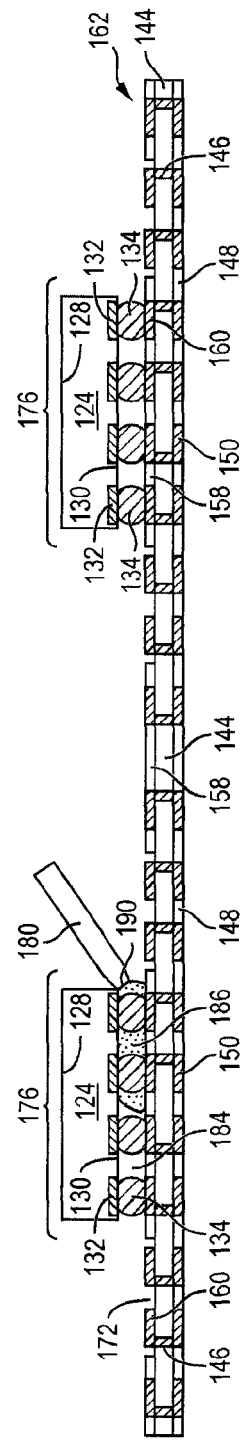
FIG. 5c
FIG. 5d

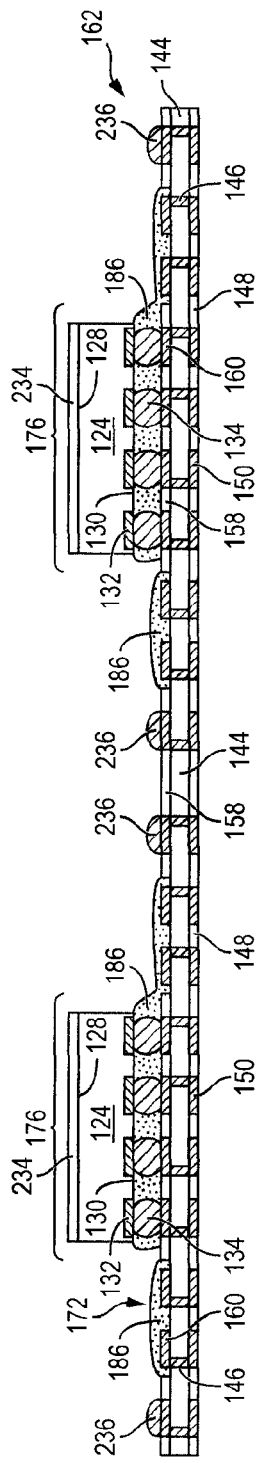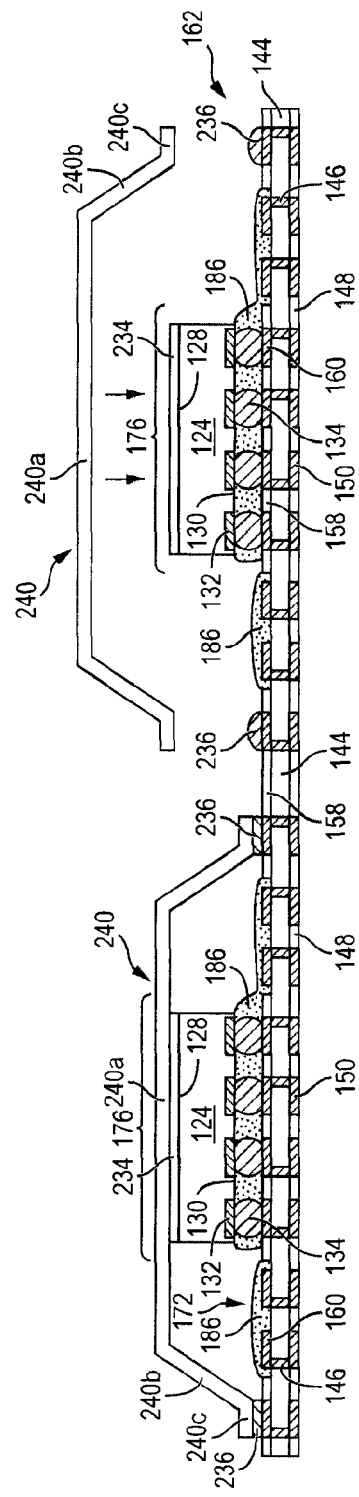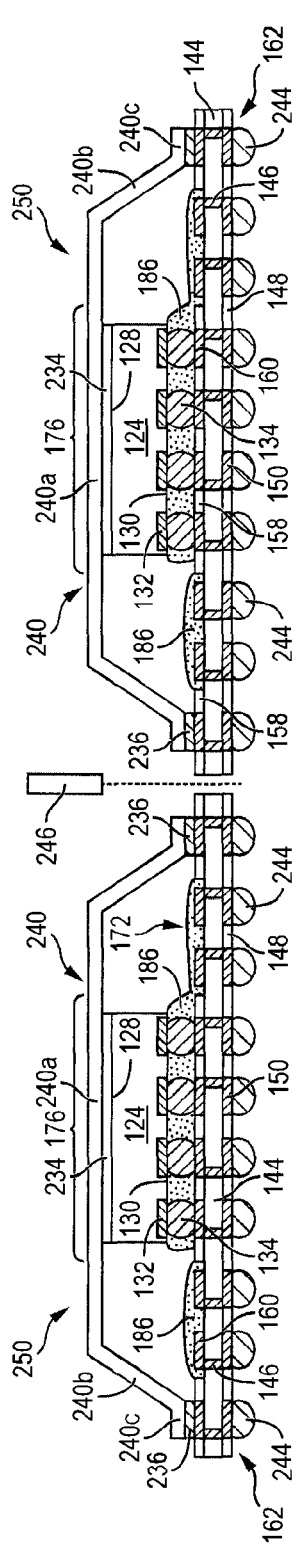
FIG. 8a
FIG. 8b
FIG. 8c

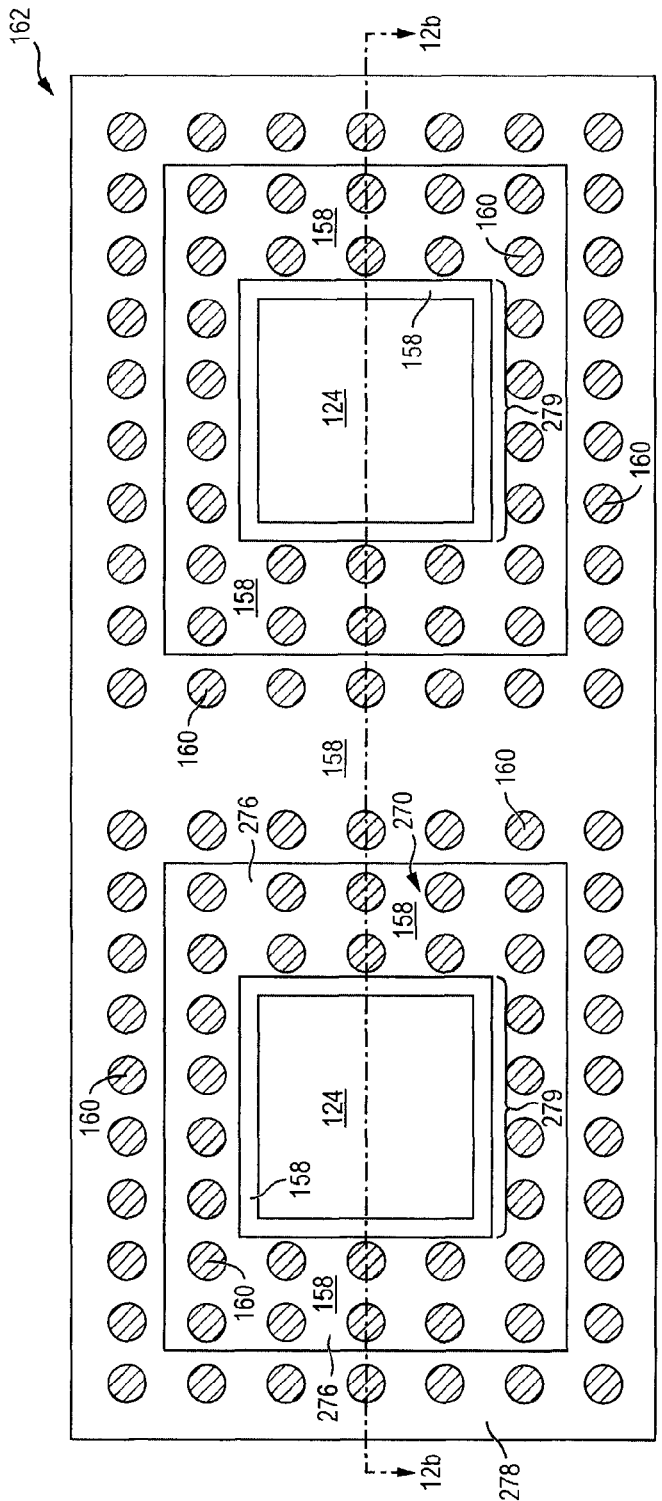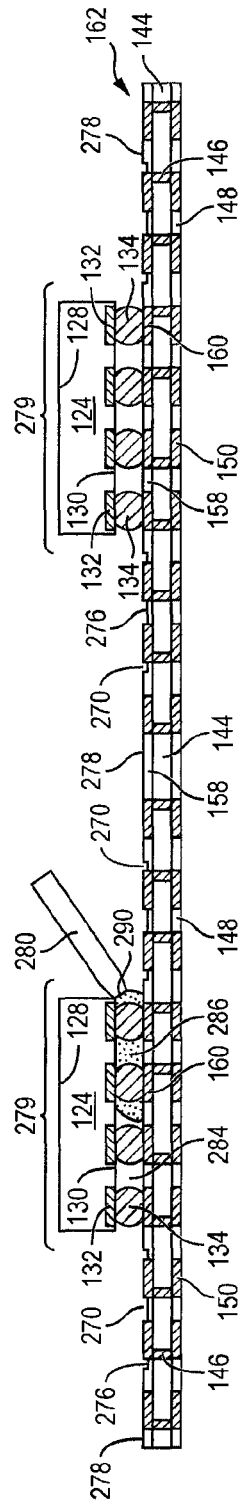
FIG. 12c
FIG. 12d

SEMICONDUCTOR DEVICE AND METHOD OF CONTROLLING WARPAGE IN SEMICONDUCTOR PACKAGE

FIELD OF THE INVENTION

The present invention relates in general to semiconductor devices and, more particularly, to a semiconductor device and method of controlling warpage in a large semiconductor package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device. Semiconductor devices, including flipchip type semiconductor die, are commonly mounted and electrically connected to a substrate with a heat spreader or heat sink mounted over the die to dissipate heat. The substrate is known to warp due to thermal and mechanical stress on the substrate. In packages with large semiconductor die, the substrate is typically much larger to accommodate the large semiconductor die and to provide adequate heat dissipation and electrical interconnect across the substrate. As the size of the semiconductor die and substrate increase, the substrate becomes increasingly prone to warpage due to thermal and mechanical stress on the substrate. Warpage of the substrate can cause joint defects or failures and reduce reliability of the electrical connections across the substrate. Warpage of the package substrate also reduces manufacturing yield and package reliability, and leads to increased cost.

SUMMARY OF THE INVENTION

A need exists to cost-effectively reduce warpage of a semiconductor device substrate. Accordingly, in one embodiment, the present invention is a method of making a semiconductor device comprising the steps of providing a substrate, forming an insulating layer over a surface of the substrate, mounting a semiconductor die over the surface of the substrate, forming a channel in the insulating layer around the semiconductor die, depositing an underfill material between the semiconductor die and the substrate and in the channel, and mounting a heat spreader over the semiconductor die with the heat spreader thermally connected to the substrate.

In another embodiment, the present invention is a method of making a semiconductor device comprising the steps of mounting a semiconductor die over a substrate, forming a channel in the substrate around the semiconductor die, depositing an underfill material in the channel, and mounting a heat spreader over the semiconductor die with the heat spreader thermally connected to the substrate.

In another embodiment, the present invention is a method of making a semiconductor device comprising the steps of mounting a semiconductor die over a substrate, forming a channel in the substrate around the semiconductor die, and depositing an underfill material in the channel.

In another embodiment, the present invention is a semiconductor device comprising a substrate. A semiconductor die is mounted over the substrate. A channel is formed in the substrate around the semiconductor die. An underfill material is deposited in the channel.

BRIEF DESCRIPTION OF THE DRAWINGS

FIGS. 5a-5g illustrate a process of mounting a semiconductor die on a substrate and depositing underfill material within a channel;

FIGS. 8a-8e illustrate a process of mounting a heat sink over a semiconductor die;

FIGS. 12a-12g illustrate a process of mounting a semiconductor die on a substrate with a channel formed partially through an insulating layer;

DETAILED DESCRIPTION OF THE DRAWINGS

Figure 1:
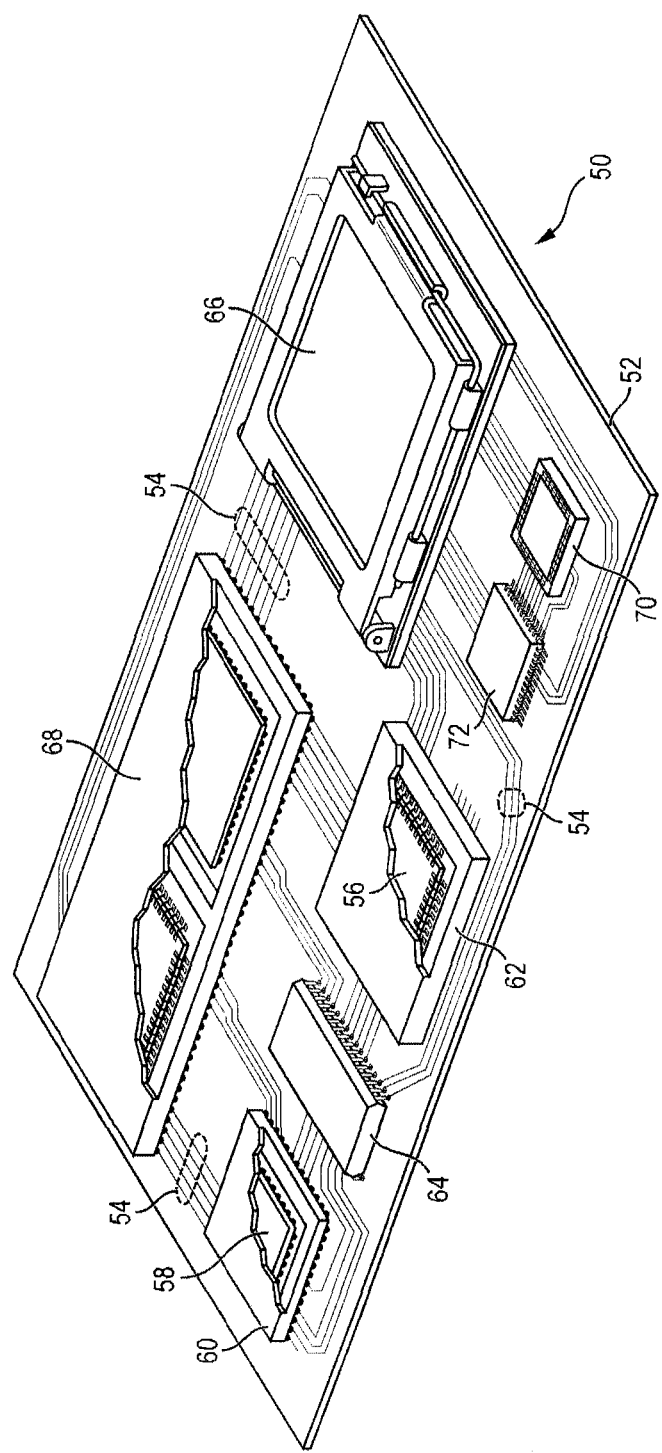
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
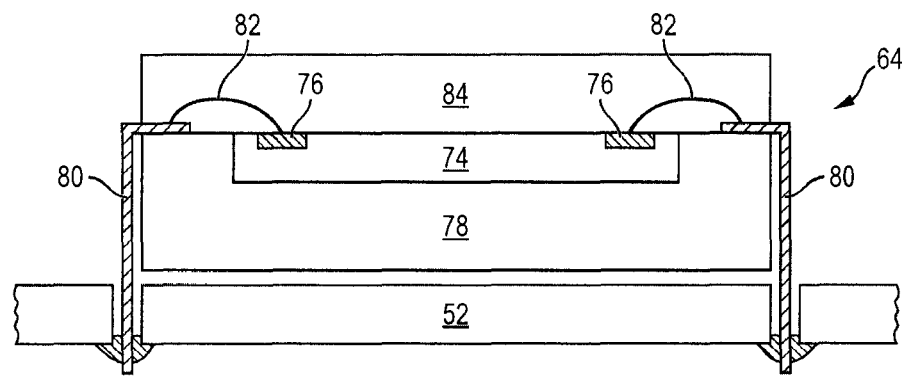
FIGS. 2a-2c illustrate further detail of the representative semiconductor packages mounted to the PCB.
Figure 2B:
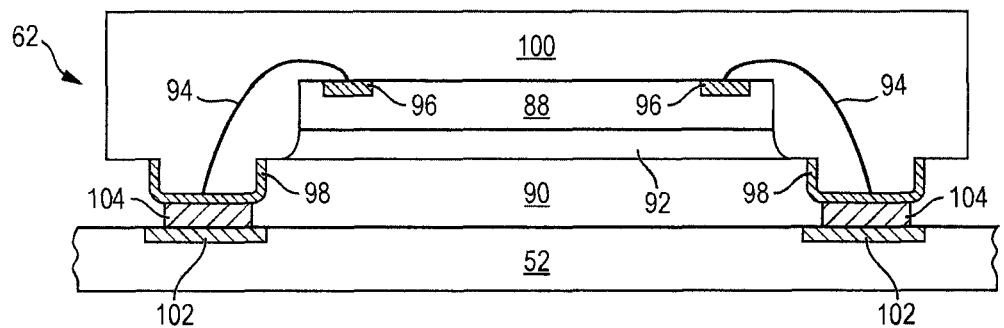
Figure 2C:
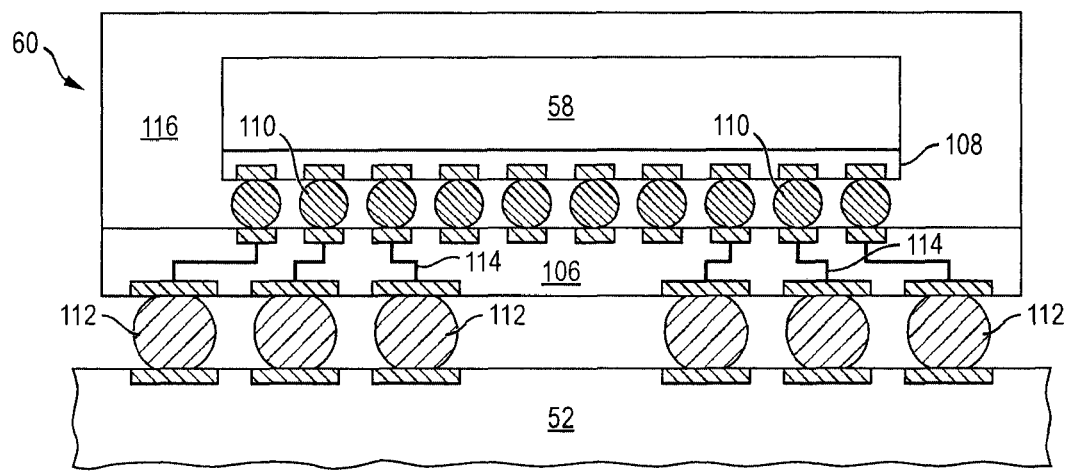

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
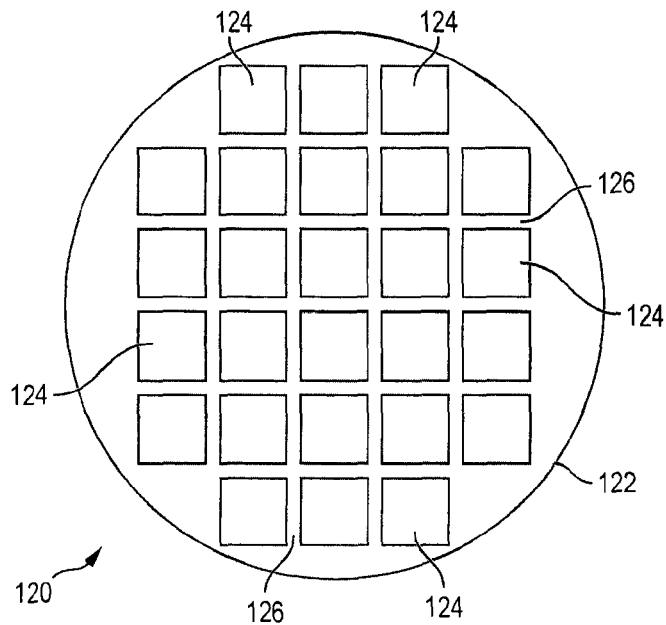
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
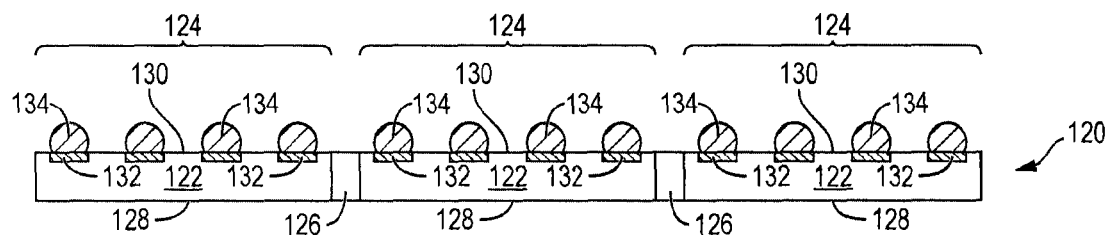

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 134. In some applications, bumps 134 are reflowed a second time to improve electrical contact to contact pads 132.

Bumps 134 can also be compression bonded or thermocompression bonded to conductive layer 132. Compression bonding uses pressure in excess of 10 megapascals (MPa) (1450 psi) at temperatures below 200° C. to bond materials via solid-state diffusion. Typical materials bonded using compression bonding include indium (In), Au, Pb, and Pb/Sn alloys. Thermocompression bonding uses elevated temperatures in conjunction with pressure to bond materials. Typical materials bonded using thermocompression bonding include Cu, Au, and Al. In one embodiment, thermocompression bonding is used to bond Au bumps by applying 30 MPa of pressure at 300° C. for 2 minutes. Bumps 134 represent one type of interconnect structure that can be formed over conductive layer 132. The interconnect structure can also use stud bump, micro bump, conductive column, composite bumps with a fusible and non-fusible portion, or other electrical interconnect.

Figure 3C:
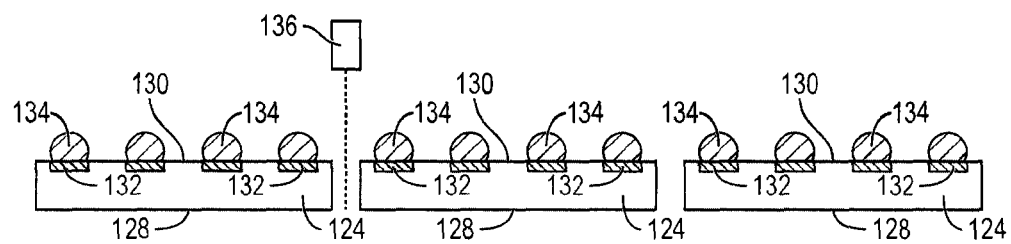

In FIG. 3c, semiconductor wafer 120 is singulated through saw street 126 using a saw blade or laser cutting tool 136 into individual semiconductor die 124.

Figure 4A:
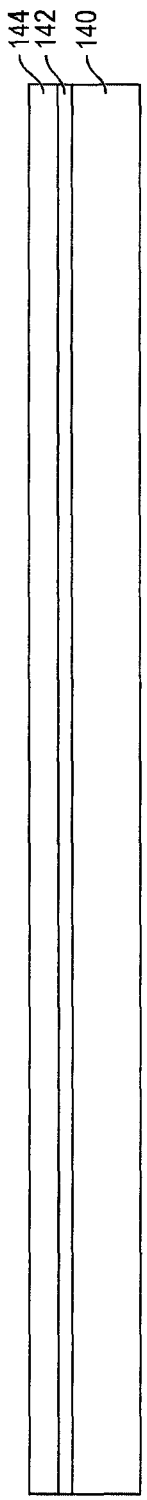
FIGS. 4a-4f illustrate a process of forming an interposer or substrate and forming a channel in the substrate.

FIGS. 4a-4f illustrate a process of forming an interposer or substrate and forming a channel in the substrate. In FIG. 4a, a temporary substrate or carrier 140 contains temporary or sacrificial base material such as silicon, germanium, gallium arsenide, indium phosphide, silicon carbide, resin, beryllium oxide, glass, or other suitable low-cost, rigid material for structural support. An interface layer or double-sided tape 142 is formed over carrier 140 as a temporary adhesive bonding film, etch-stop layer, or release layer. A substrate or PCB 144 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, substrate 144 contains one or more laminated insulating or dielectric layers. In another embodiment, substrate 144 contains base material, such as silicon, germanium, gallium arsenide, indium phosphide, or silicon carbide, for structural support. As a semiconductor wafer, substrate 144 can contain embedded integrated semiconductor die or discrete devices. Substrate 144 can also be a multi-layer flexible laminate, ceramic, or leadframe. Substrate 144 is mounted to interface layer 142 over carrier 140.

Figure 4B:
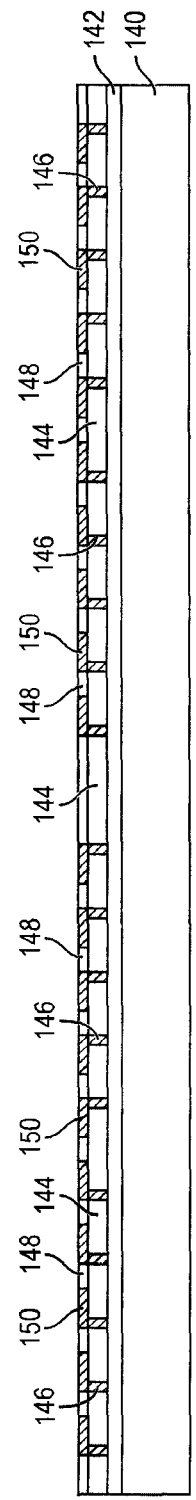

In FIG. 4b, a plurality of vias is formed through substrate 144 using laser drilling, mechanical drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive vias 146.

An insulating or passivation layer 148 is formed over a surface of substrate 144 and conductive vias 146 using PVD, CVD, printing, spin coating, spray coating, sintering or thermal oxidation. The insulating layer 148 contains one or more layers of silicon dioxide (SiO2), silicon nitride (Si3N4), silicon oxynitride (SiOn), tantalum pentoxide (Ta2O5), aluminum oxide (Al2O3), or other material having similar insulating and structural properties. A portion of insulating layer 148 is removed by an etching process with a patterned photoresist layer to expose substrate 144 and conductive vias 146.

An electrically conductive layer or redistribution layer (RDL) 150 is formed over the exposed substrate 144 and conductive vias 146 using a patterning and metal deposition process such as printing, PVD, CVD, sputtering, electrolytic plating, and electroless plating. Conductive layer 150 includes one or more layers of Al, Cu, Sn, Ni, Au, Ag, or other suitable electrically conductive material. Conductive layer 150 is electrically connected to conductive vias 146.

Figure 4C:
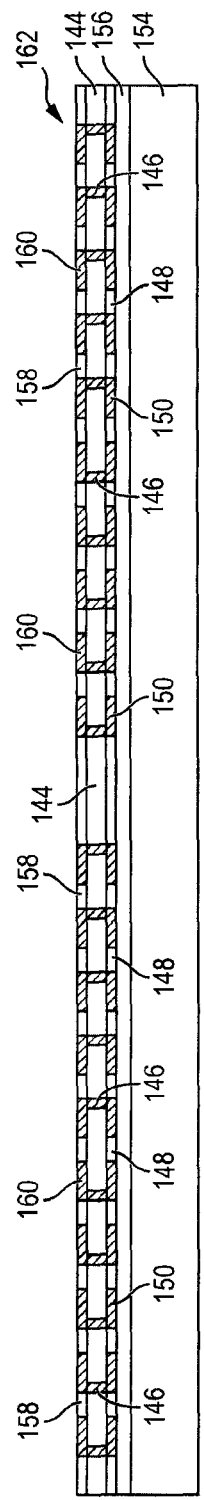

In FIG. 4c, a temporary substrate or carrier 154 contains sacrificial base material such as silicon, polymer, beryllium oxide, glass, or other suitable low-cost, rigid material for structural support. An interface layer or double-sided tape 156 is formed over carrier 154 as a temporary adhesive bonding film, etch-stop layer, or release layer. Leading with insulating layer 148 and conductive layer 150, substrate 144 is mounted to interface layer 156 over carrier 154. Carrier 140 and interface layer 142 are removed by chemical etching, mechanical peeling, CMP, mechanical grinding, thermal bake, UV light, laser scanning, or wet stripping to expose a surface of substrate 144 and conductive vias 146 opposite conductive layer 150.

An insulating or passivation layer 158 is formed over substrate 144 and conductive vias 146 using PVD, CVD, printing, spin coating, spray coating, sintering or thermal oxidation. The insulating layer 158 contains one or more layers of SiO2, Si3N4, SiOn, Ta2O5, Al2O3, or other material having similar insulating and structural properties. A portion of insulating layer 158 is removed by an etching process with a patterned photoresist layer to expose substrate 144 and conductive vias 146.

An electrically conductive layer or RDL 160 is formed over the exposed substrate 144 and conductive vias 146 using a patterning and metal deposition process such as printing, PVD, CVD, sputtering, electrolytic plating and electroless plating. Conductive layer 160 includes one or more layers of Al, Cu, Sn, Ni, Au, Ag, or other suitable electrically conductive material. Conductive layer 160 is electrically connected to conductive vias 146 and conductive layer 150. In another embodiment, conductive vias 146 are formed through substrate 144 after forming conductive layers 150 and/or 160. Conductive layers 150 and 160 can also be formed prior to insulating layer 148 and 158, respectively.

The resulting interposer or substrate 162 provides electrical interconnect vertically and laterally across the substrate through conductive layers 150 and 160 and conductive vias 146 according to the electrical function of semiconductor die 124. Portions of conductive layers 150 and 160 and conductive vias 146 are electrically common or electrically isolated according to the design and function of semiconductor die 124.

Figure 4D:
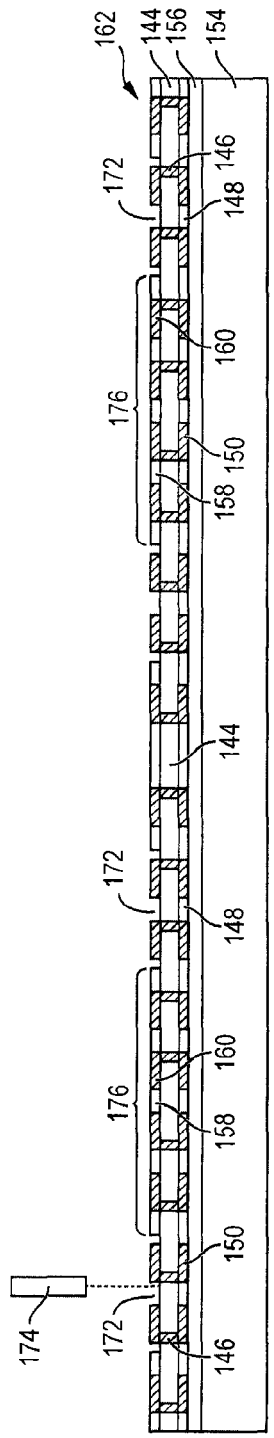

In FIG. 4d, a portion of insulating layer 158 is removed by an etching process using a patterned photoresist layer to form a channel or groove 172. Alternatively, a portion of insulating layer 158 is removed by laser direct ablation (LDA) using laser 174 to form channel 172. Channel 172 extends through insulating layer 158 to expose substrate 144. The removal of insulating layer 158 does not remove conductive layer 160. The formation of channel 172 leaves conductive layer 160 intact for electrical interconnect. A central region 176 of insulating layer 158, interior to channel 172, is not removed and insulating layer 158 maintains coverage over substrate 144 within central region 176.

Figure 4E:
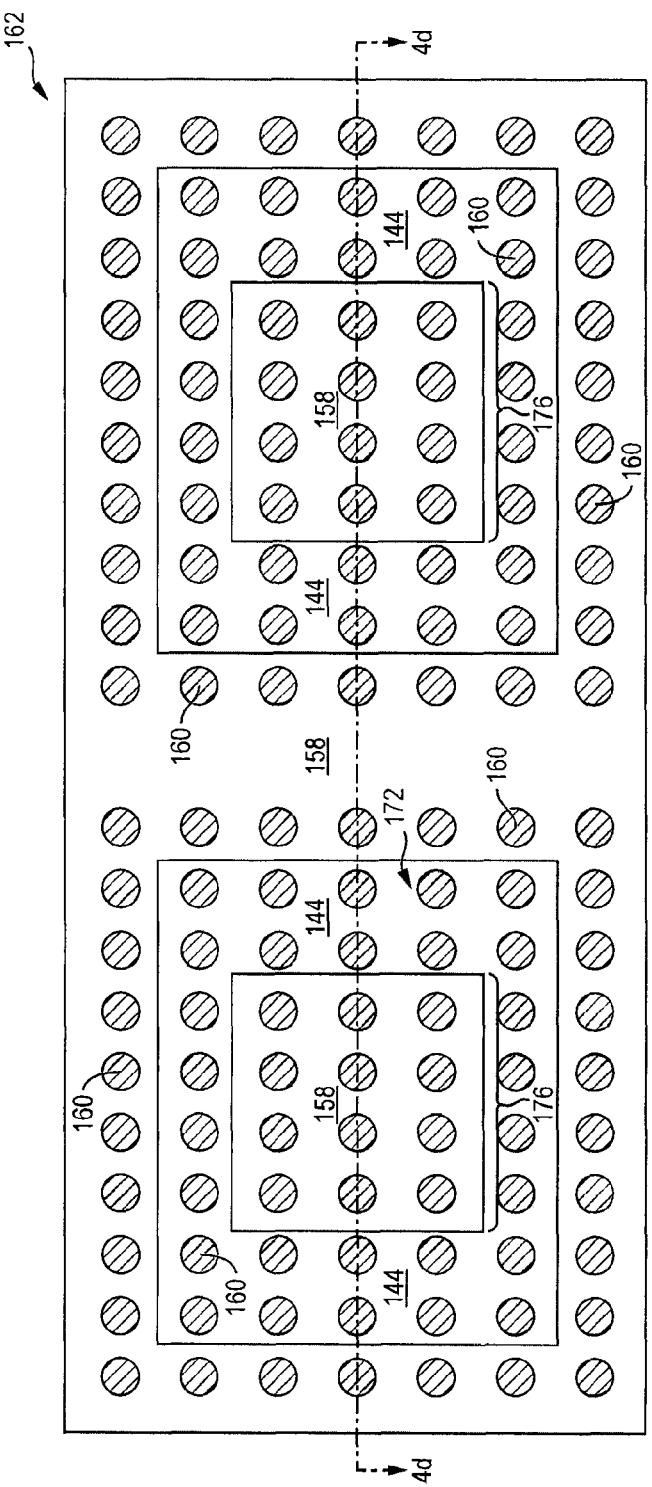
Figure 4F:
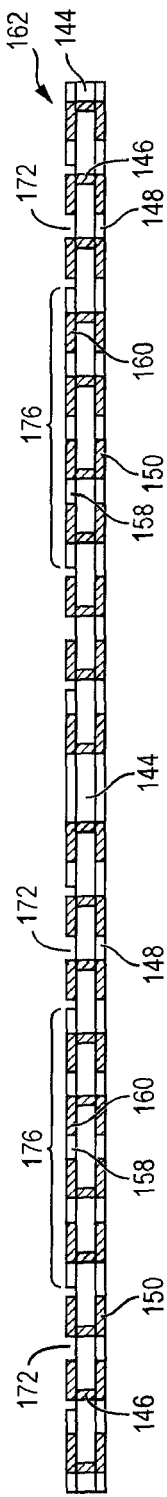

FIG. 4e shows a top or plan view of the assembly from FIG. 4d. Channel 172 extends through insulating layer 158 to expose substrate 144. Channel 172 is formed in a generally square, rectangular, or box pattern or footprint, with a central region 176 of insulating layer 158, interior to channel 172, where insulating layer 158 maintains coverage over substrate 144. The shape or pattern of channel 172 can vary according to the design and function of semiconductor die 124 and can be, for example, generally circular or oval. In FIG. 4f, carrier 154 and interface layer 156 from FIG. 4d are removed by chemical etching, mechanical peeling, CMP, mechanical grinding, thermal bake, UV light, laser scanning, or wet stripping to expose conductive layer 150 and insulating layer 148.

Figure 5A:
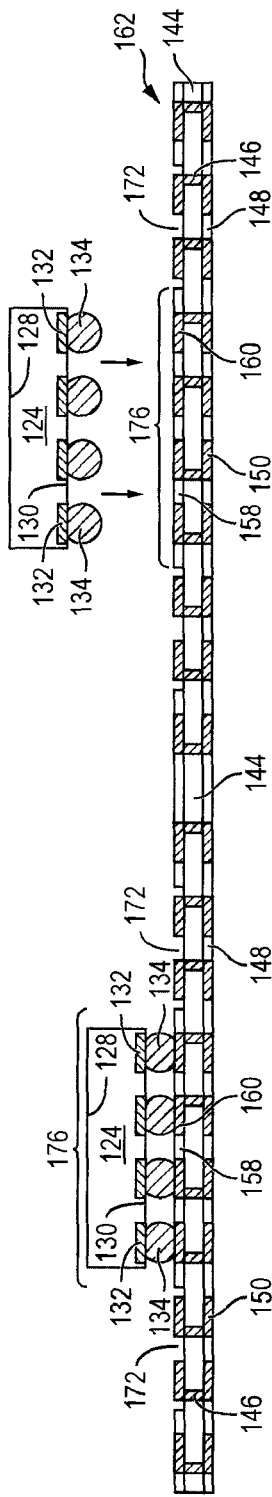

FIGS. 5a-5g illustrate, in relation to FIGS. 1 and 2a-2c, a process of mounting a semiconductor die on a substrate and depositing underfill material within a channel. In FIG. 5a, semiconductor die 124 from FIGS. 3a-3c are positioned over and mounted to substrate 162 over central region 176 of insulating layer 158, interior to channel 172, using a pick and place operation with active surface 130 oriented toward the substrate. Bumps 134 are aligned with conductive layer 160. Semiconductor die 124 is mounted to substrate 162 by reflowing bumps 134 to electrically and metallurgically connect bumps 134 to conductive layer 160.

Figure 5B:
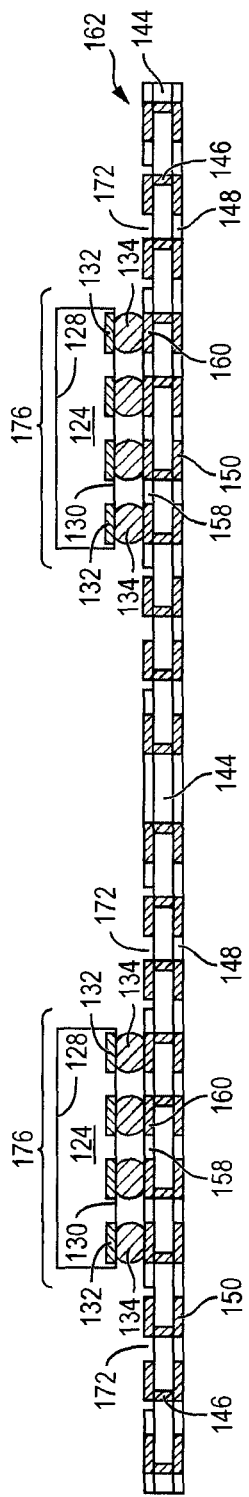

FIG. 5b shows semiconductor die 124 mounted over substrate 162. Bumps 134 are electrically connected to conductive layers 160 and 150 and conductive vias 146 according to the electrical design and function of semiconductor die 124. The circuits on active surface 130 of semiconductor die 124 are electrically connected through conductive layer 132 and bumps 134 to conductive vias 146 and conductive layers 150 and 160.

FIG. 5c shows a top or plan view of the assembly from FIG. 5b. Channel 172 extends through insulating layer 158 to expose substrate 144. Semiconductor die 124 is mounted over substrate 162. Channel 172 surrounds the perimeter of semiconductor die 124 outside a footprint of semiconductor die 124. Channel 172 is laterally offset from the footprint of semiconductor die 124 and is formed as a ring surrounding semiconductor die 124 with a generally square, rectangular, or box pattern or footprint. A central region 176 of insulating layer 158, interior to channel 172, maintains coverage over substrate 144. Substrate 144 is exposed within channel 172 where insulating layer 158 is removed. The shape or footprint of channel 172 can vary according to the design and function of semiconductor die 124 and can be, for example, generally circular or oval.

FIG. 5d shows an underfill dispenser 180 placed in fluid communication with area 184 between semiconductor die 124 and substrate 162. A capillary underfill material (CUF) or encapsulant material 186 is injected under pressure from outlet 190 of dispenser 180 into area 184 between semiconductor die 124 and substrate 162 around bumps 134. CUF 186 can be polymer composite material, such as epoxy resin with filler, epoxy acrylate with filler, or polymer with proper filler. CUF 186 is non-conductive and environmentally protects the semiconductor device from external elements and contaminants.

Figure 5E:
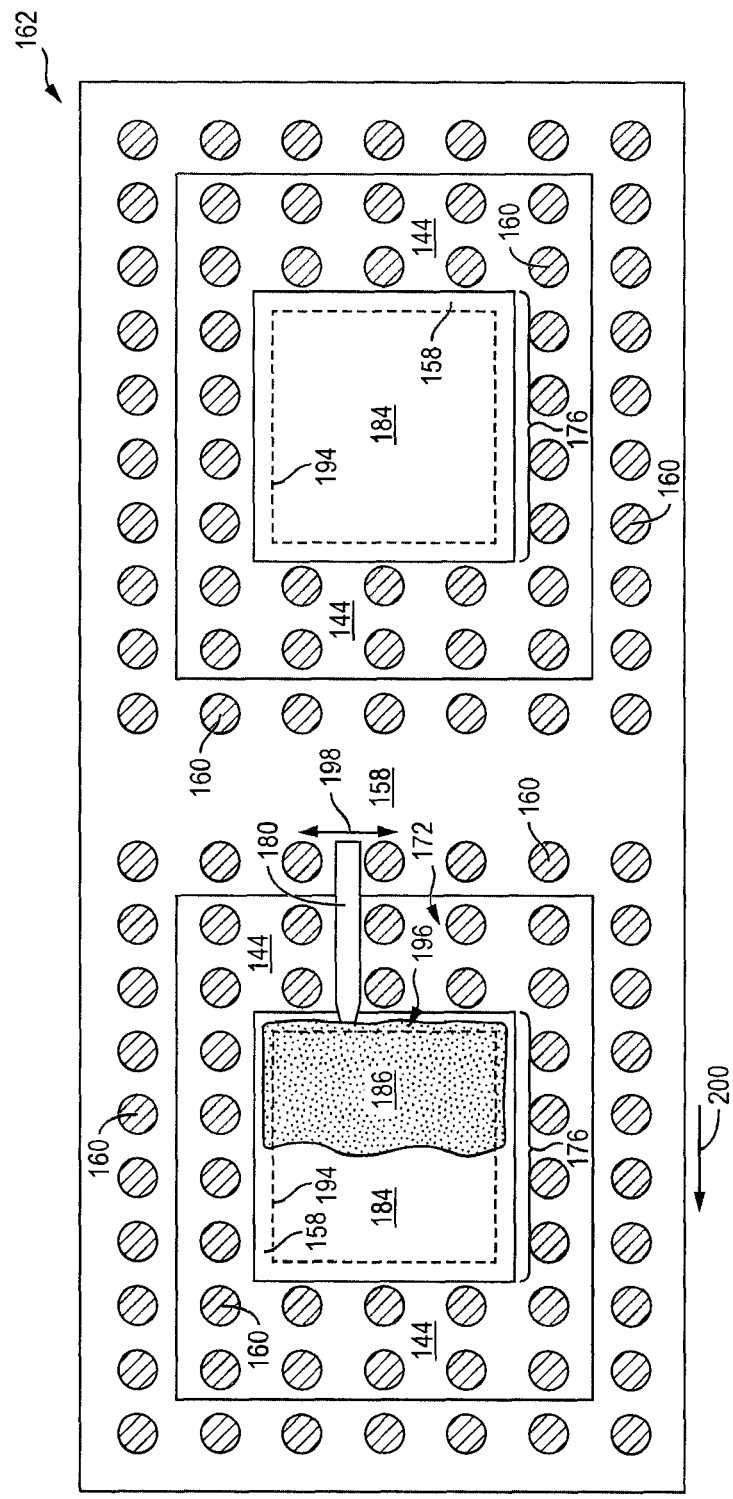

FIG. 5e shows a plan view of CUF 186 filling area 184 between semiconductor die 124 and substrate 162 within semiconductor die footprint or semiconductor die site 194. Dispenser 180 moves back and forth along a single edge 196 of semiconductor die 124 to inject CUF 186 into area 184 under pressure, as shown by arrows 198. As dispenser 180 moves back and forth along edge 196 of semiconductor die 124, CUF 186 is distributed evenly within area 184 and flows under semiconductor die 124 and around bumps 134 in direction 200, perpendicular to edge 196 of semiconductor die 124. A portion of CUF 186 flows or bleeds outside semiconductor die site 194 and extends outside the footprint of semiconductor die 124. The distribution of CUF 186 can be controlled by adjusting the rate of motion of dispenser 180 and the flow rate of CUF 186, to reduce bleed-out of excess CUF 186 outside the footprint of semiconductor die 124.

Figure 5F:
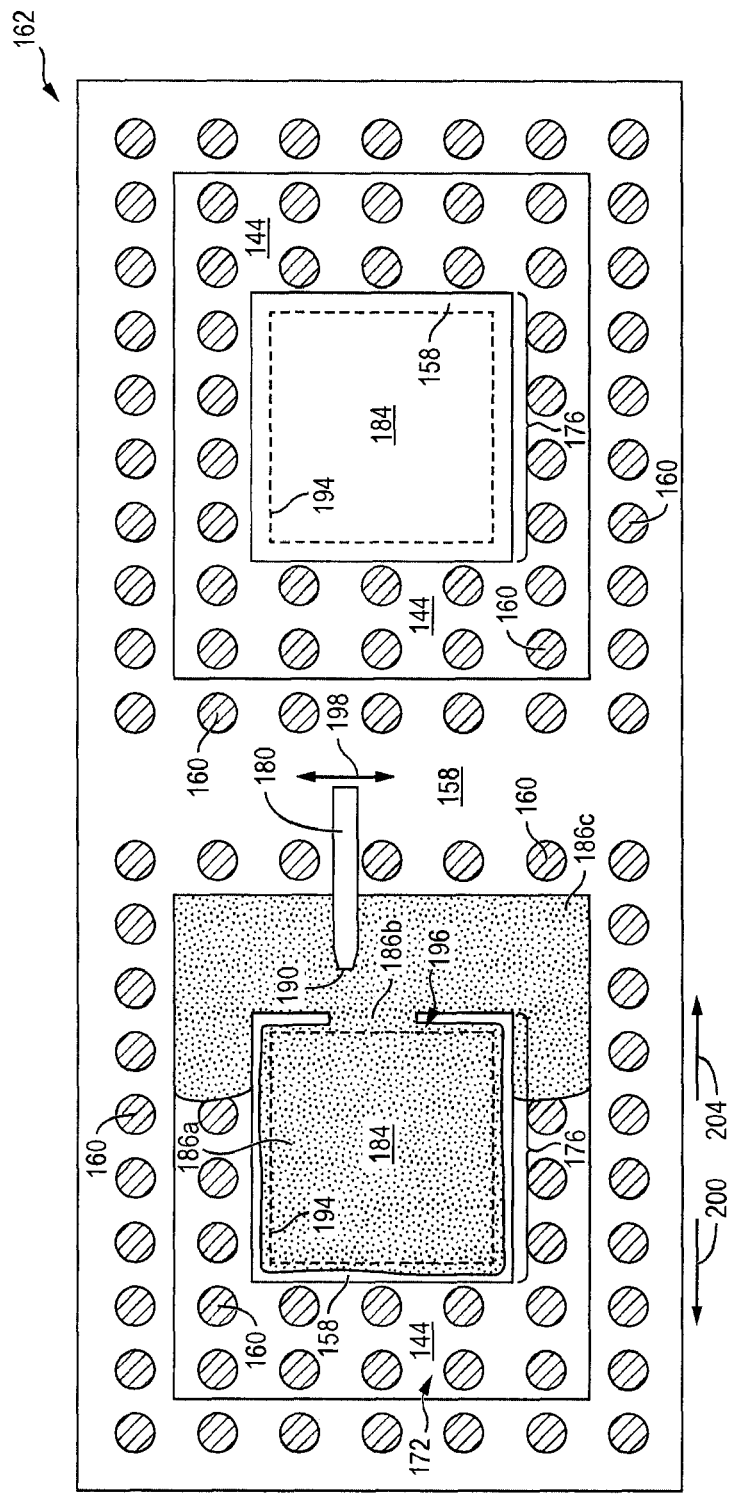

FIG. 5f shows the assembly after a portion of CUF 186, CUF 186a, completely fills area 184 between semiconductor die 124 and substrate 162. Dispenser 180 is moved away from edge 196 of semiconductor die 124 in direction 204, opposite from direction 200 and perpendicular to edge 196. As dispenser 180 is moved away from edge 196 of semiconductor die 124, a portion of CUF 186, CUF 186b, covers a portion of insulating layer 158 outside the footprint of semiconductor die 124. Dispenser 180 is placed in fluid communication with channel 172 and CUF 186 is deposited in channel 172. CUF 186 flows within channel 172 parallel to edge 196 of semiconductor die 124, and along direction 200. Dispenser 180 can be moved around channel 172 or held stationary to control the flow of CUF 186 within channel 172.

Figure 5G:
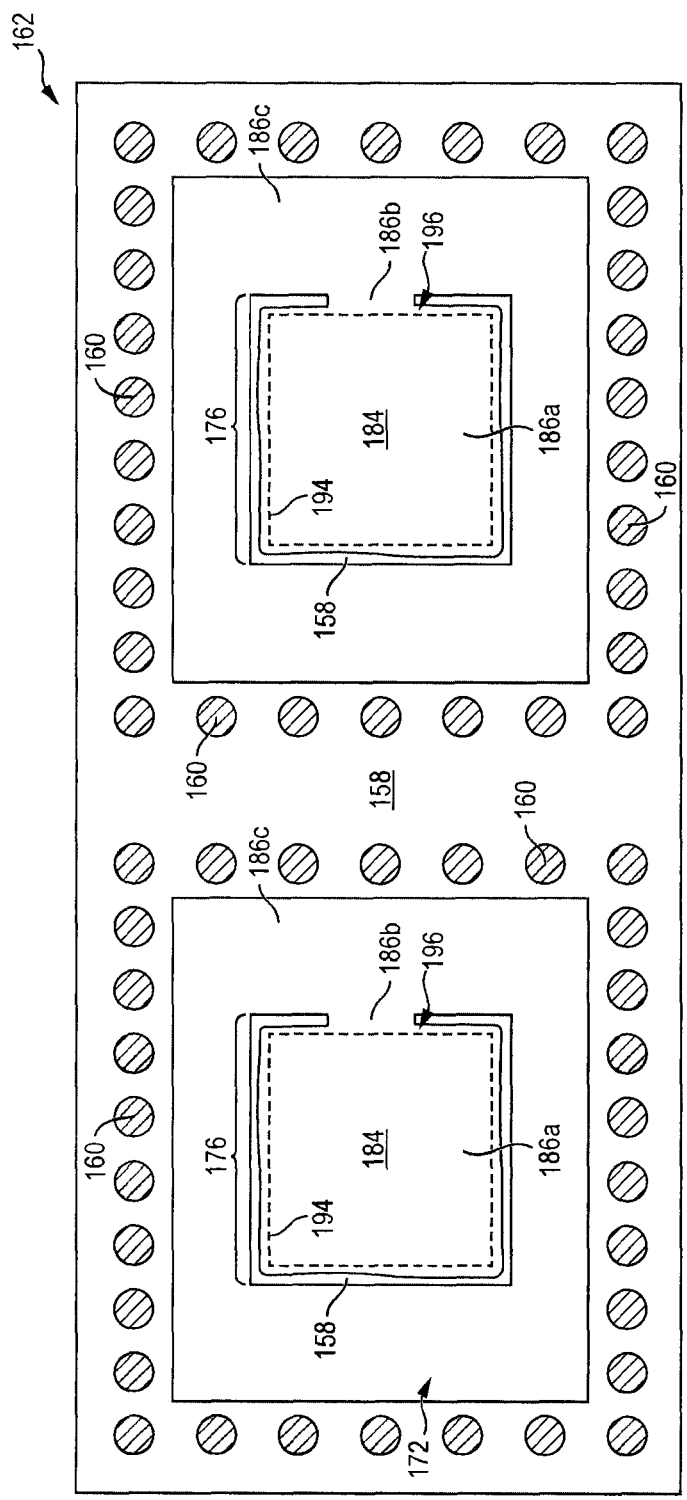

FIG. 5g shows CUF 186 deposited in channel 172 around semiconductor die 124 and between semiconductor die 124 and substrate 162 within a footprint of semiconductor die 124. CUF 186 is distributed evenly under semiconductor die 124 and around semiconductor die 124 within channel 172. CUF 186a is distributed evenly within area 184 between semiconductor die 124 and substrate 162. A portion of CUF 186, 186b, is deposited over insulating layer 158 outside the footprint of semiconductor die 124 as dispenser 180 is moved away from edge 196 of semiconductor die 124. CUF 186c is deposited within channel 172 around semiconductor die 124. CUF 186 is stronger and more durable than insulating layer 158, and depositing CUF 186 in channel 172 provides additional structural support to substrate 162 for reducing warpage of substrate 162 without adding significant weight or volume to the package. Additionally, CUF 186 has a lower coefficient of thermal expansion (CTE) than insulating layer 158, and provides structural support to substrate 162 and reduces warpage of substrate 162 under thermal stress. Because CUF 186 is deposited within channel 172 during the same processing step of depositing CUF 186 under semiconductor die 124, CUF 186 provides additional structural support to substrate 162 without significantly increasing the manufacturing time or cost of the package.

Figure 6A:
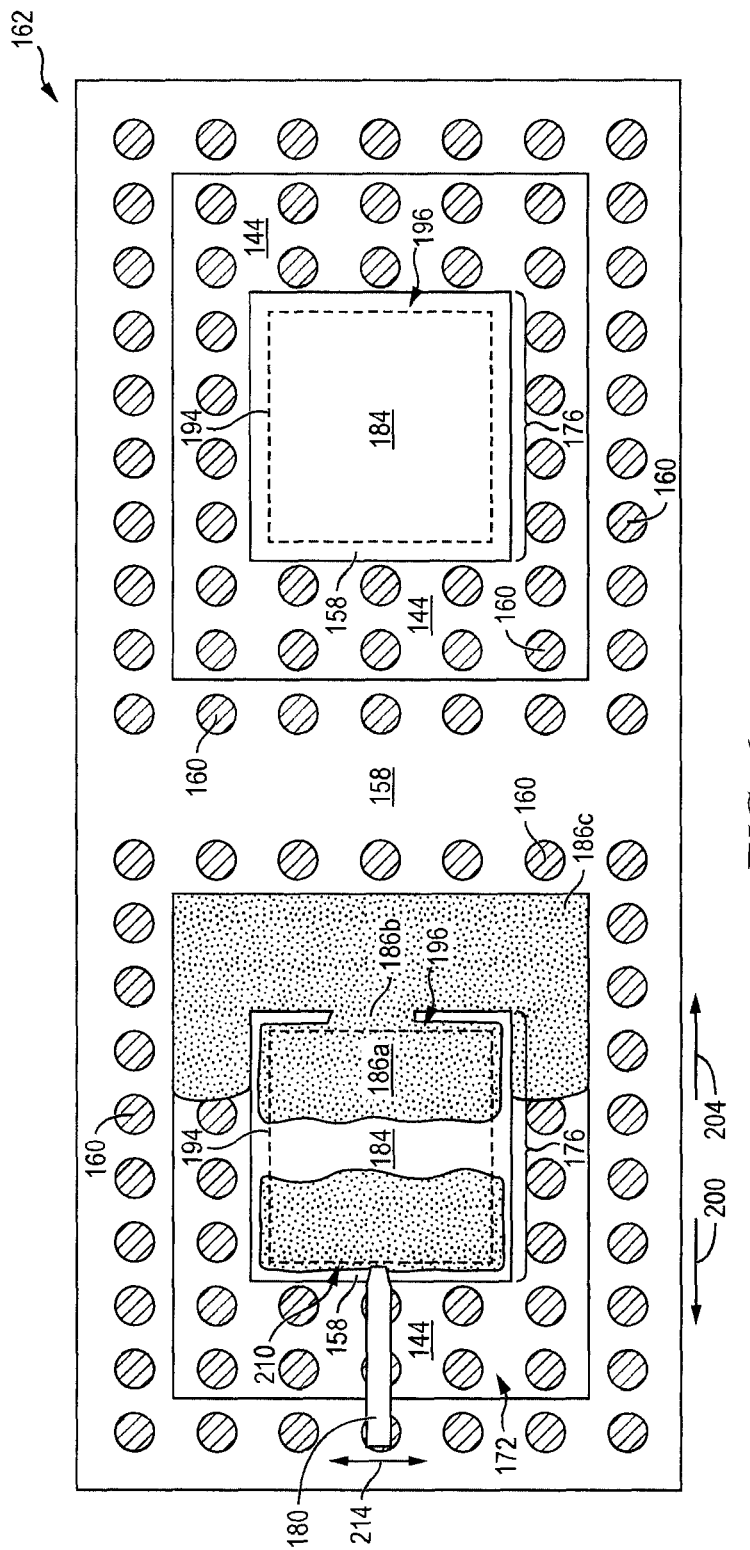
FIGS. 6a-6c illustrate a process of depositing underfill material between a semiconductor die and a substrate from opposite edges of the semiconductor die.
Figure 6B:
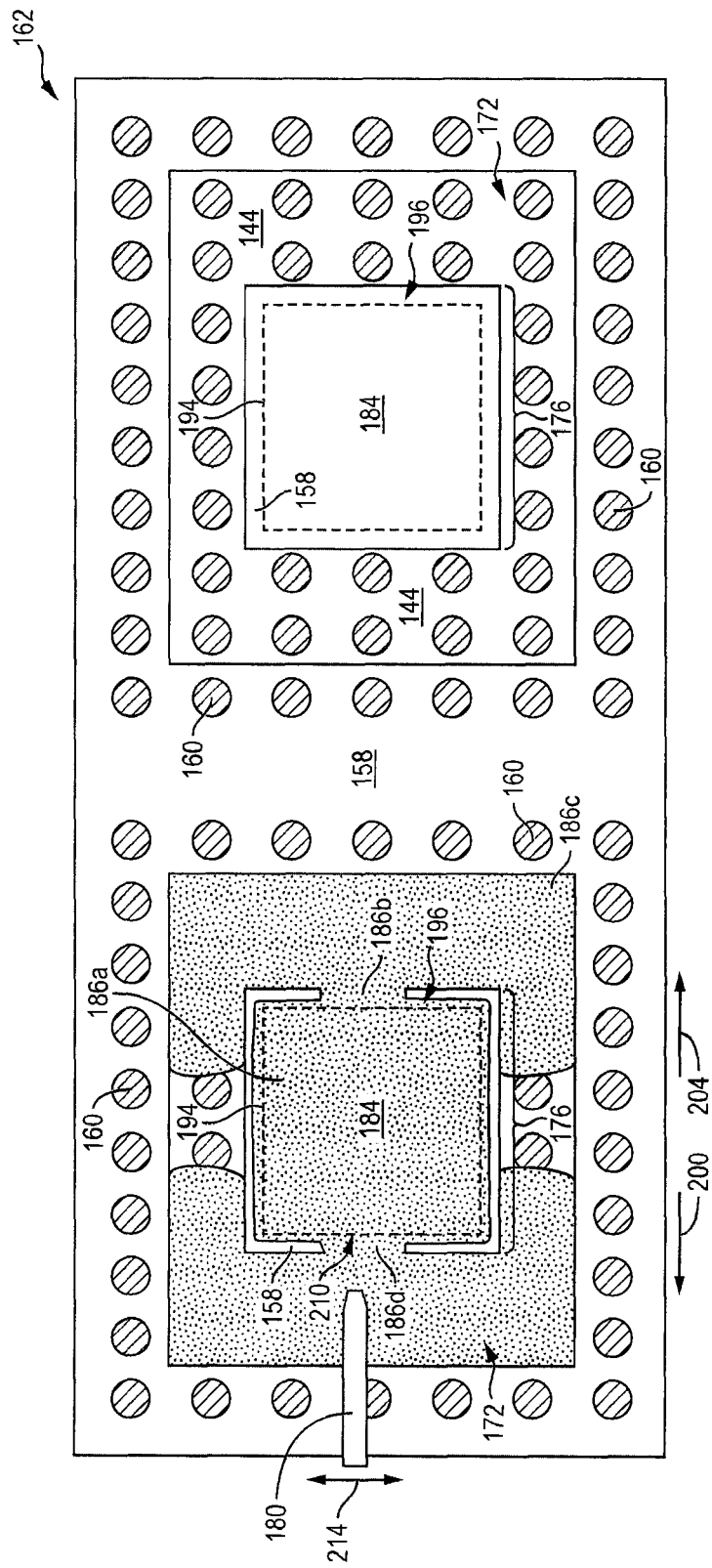
Figure 6C:
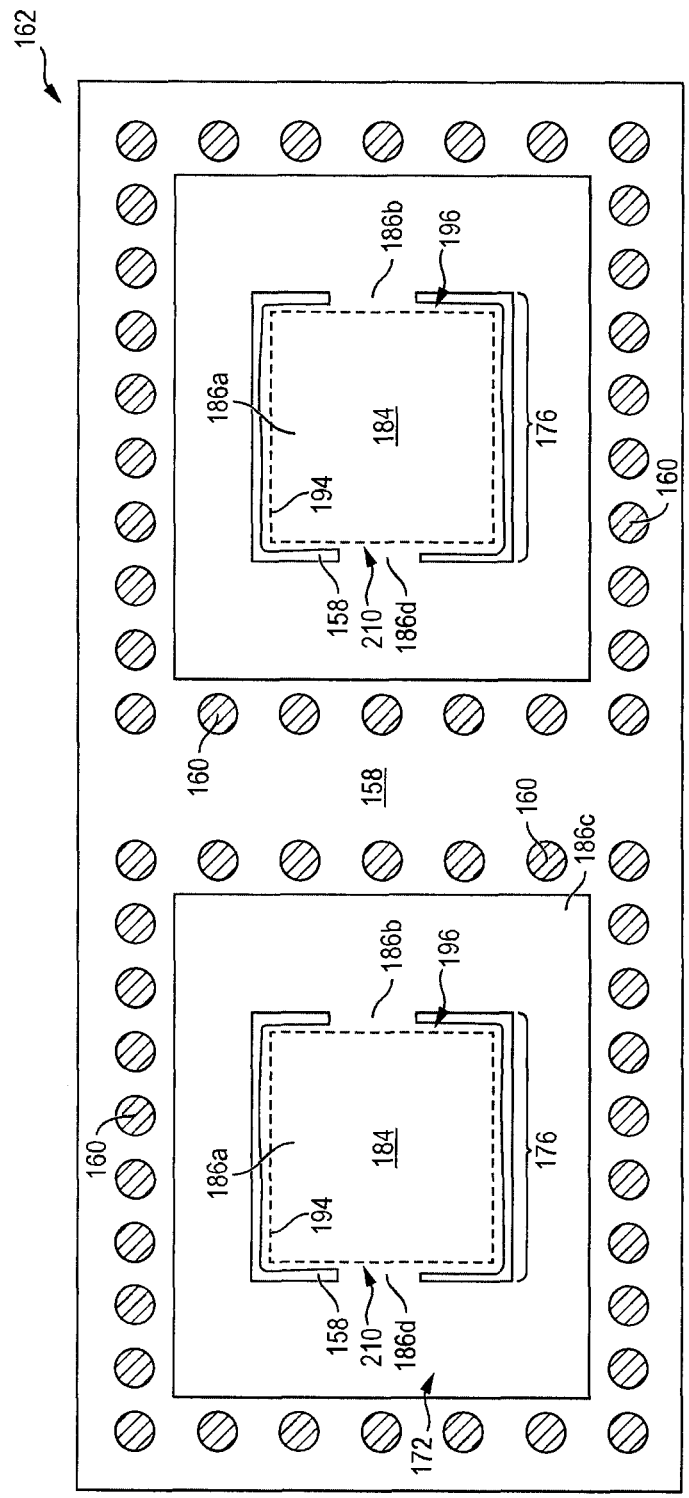

FIGS. 6a-6c illustrate a process for depositing underfill material between a semiconductor die and a substrate and around a semiconductor die from opposite edges of the semiconductor die. Continuing from FIG. 5e, after CUF 186 partially fills area 184 between semiconductor die 124 and substrate 162, but before completely filling area 184, dispenser 180 is moved away from edge 196 of semiconductor die 124 in direction 204, opposite direction 200 and perpendicular to edge 196, as shown in FIG. 6a. As dispenser 180 is moved away from edge 196 of semiconductor die 196, a portion of CUF 186, CUF 186b, covers a portion of insulating layer 158. Dispenser 180 is placed in fluid communication with channel 172 and CUF 186 is deposited in channel 172. CUF 186 flows within channel 172 parallel to edge 196 of semiconductor die 124, and along direction 200. Dispenser 180 can be moved around channel 172 or held stationary to control the flow of CUF 186 within channel 172.

After CUF 186 partially fills channel 172, dispenser 180 is placed in fluid communication with area 184 between semiconductor die 124 and substrate 162 along edge 210 of semiconductor die 124 opposite edge 196. CUF 186 is injected into area 184 between semiconductor die 124 and substrate 162 around bumps 134. Dispenser 180 moves back and forth along edge 210 of semiconductor die 124 to inject CUF 186 into area 184 under pressure, as shown by arrows 214. As dispenser 180 moves back and forth along edge 210 of semiconductor die 124, CUF 186 is distributed evenly within area 184 and flows under semiconductor die 124 in direction 204, perpendicular to edge 210 of semiconductor die 124. A portion of CUF 186 flows or bleeds outside semiconductor die site 194 and extends outside the footprint of semiconductor die 124. The distribution of CUF 186 can be controlled by adjusting the rate of motion of dispenser 180 and the flow rate of CUF 186, to reduce bleed-out of excess CUF 186 outside the footprint of semiconductor die 124.

FIG. 6b shows the assembly after a portion of CUF 186, CUF 186a, completely fills area 184 between semiconductor die 124 and substrate 162. Dispenser 180 is moved away from edge 210 of semiconductor die 124 in direction 200, perpendicular to edge 210 of semiconductor die 124. As dispenser 180 is moved away from edge 210 of semiconductor die 124, a portion of CUF 186, 186d, covers a portion of insulating layer 158 outside the footprint of semiconductor die 124. Dispenser 180 is placed in fluid communication with channel 172 and CUF 186 is deposited in channel 172. CUF 186 flows within channel 172 parallel to edge 210 of semiconductor die 124, and along direction 204. Dispenser 180 can be moved around channel 172 or held stationary to control the flow of CUF 186 within channel 172.

FIG. 6c shows CUF 186 deposited in channel 172 around semiconductor die 124 and between semiconductor die 124 and substrate 162 within a footprint of semiconductor die 124. CUF 186 is distributed evenly under semiconductor die 124 and around semiconductor die 124 within channel 172. CUF 186a is distributed evenly within area 184 between semiconductor die 124 and substrate 162. A portion of CUF 186, 186b, is deposited over insulating layer 158 outside the footprint of semiconductor die 124 as dispenser 180 is moved away from edge 196 of semiconductor die 124. A portion of CUF 186, 186d, is deposited over insulating layer 158 outside the footprint of semiconductor die 124 as dispenser 180 is moved away from edge 210 of semiconductor die 124. CUF 186c is deposited within channel 172 around semiconductor die 124. CUF 186 is stronger and more durable than insulating layer 158, and depositing CUF 186 in channel 172 provides additional structural support to substrate 162 for reducing warpage of substrate 162 without adding significant weight or volume to the package. Additionally, CUF 186 has a lower CTE than insulating layer 158, and provides structural support to substrate 162 and reduces warpage of substrate 162 under thermal stress. Because CUF 186 is deposited within channel 172 during the same processing step of depositing CUF 186 under semiconductor die 124, CUF 186 provides additional structural support to substrate 162 without significantly increasing the manufacturing time or cost of the package. Additionally, depositing CUF 186 between semiconductor die 124 and substrate 162 and within channel 172 from opposite edges 196 and 210 of semiconductor die 124 provides for more even distribution of CUF 186 within a footprint of semiconductor die 124 and within channel 172 and reduces voids in CUF 186.

Figure 7:
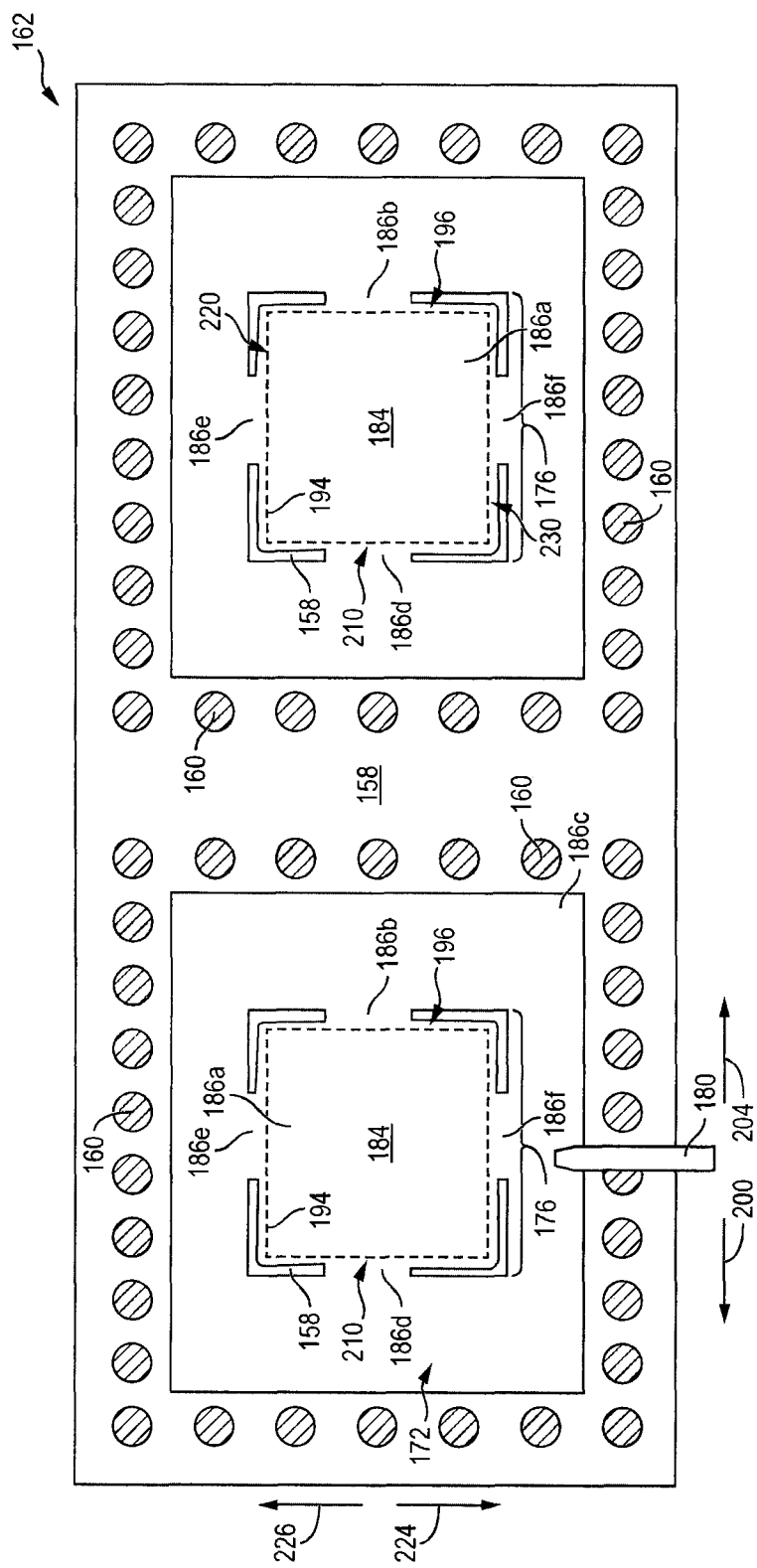
FIG. 7 illustrates an underfill material deposited between a semiconductor die and a substrate from each edge of the semiconductor die.

FIG. 7 shows an underfill material deposited between a semiconductor die and a substrate from each edge of the semiconductor die. Similar to FIGS. 6a-6c, CUF 186 is partially deposited between semiconductor die 124 and substrate 162 by placing dispenser 180 in fluid communication with edges 196 and 210. After partially filling the area between semiconductor die 124 and substrate 162, dispenser 180 is moved away from edges 196 and 210, and CUF 186 is deposited in channel 172. As dispenser 180 is moved away from edges 196 and 210, portions of CUF 186, 186b and 186d, cover a portion of insulating layer 158 outside the footprint of semiconductor die 124.

Similarly, dispenser 180 is placed in fluid communication with area 184 between semiconductor die 124 and substrate 162 along edge 220 of semiconductor die 124. CUF 186 is injected under pressure from dispenser 180 into area 184 between semiconductor die 124 and substrate 162 and around bumps 134. Dispenser 180 moves back and forth along edge 220 of semiconductor die 124 in directions 200 and 204. As dispenser 180 moves back and forth along edge 220 of semiconductor die 124, CUF 186 is distributed evenly within area 184 and flows evenly in direction 224, perpendicular to edge 220 of semiconductor die 124. A portion of CUF 186 flows or bleeds outside the footprint of semiconductor die 124. The distribution of CUF 186 can be controlled by adjusting the rate of motion of dispenser 180 and the flow rate of CUF 186, to reduce bleed-out of excess CUF 186 outside the footprint of semiconductor die 124. After area 184 is partially filled with CUF 186 from edge 220 of semiconductor die 124, dispenser 180 is moved away from edge 220 of semiconductor die 124 in direction 226, opposite direction 224 and perpendicular to edge 220. As dispenser 180 is moved away from edge 220 of semiconductor die 124, a portion of CUF 186, CUF 186e, covers a portion of insulating layer 158 outside the footprint of semiconductor die 124. Dispenser 180 is placed in fluid communication with channel 172 and CUF 186 is deposited in channel 172. CUF 186 flows within channel 172 parallel to edge 220 and along directions 200 and 204. Dispenser 180 can be moved around channel 172 or held stationary to control the flow of CUF 186 within channel 172.

After partially depositing CUF 186 within area 184 from edges 196, 210, and 220 of semiconductor die 124, dispenser 180 is placed in fluid communication with area 184 between semiconductor die 124 and Substrate 162 along edge 230 of semiconductor die 124. CUF 186 is injected under pressure from dispenser 180 into area 184 between semiconductor die 124 and substrate 162 and around bumps 134. Dispenser 180 moves back and forth along edge 230 of semiconductor die 124 in directions 200 and 204. As dispenser 180 moves back and forth along edge 230 of semiconductor die 124, CUF 186 is distributed evenly within area 184 and flows evenly in direction 226, perpendicular to edge 230 of semiconductor die 124. A portion of CUF 186 flows or bleeds outside the footprint of semiconductor die 124. The distribution of CUF 186 can be controlled by adjusting the rate of motion of dispenser 180 and the flow rate of CUF 186, to reduce bleed-out of excess CUF 186 outside the footprint of semiconductor die 124. After area 184 is partially filled with CUF 186 from edge 230 of semiconductor die 124, dispenser 180 is moved away from edge 230 of semiconductor die 124 in direction 224, opposite direction 226 and perpendicular to edge 230. As dispenser 180 is moved away from edge 230 of semiconductor die 124, a portion of CUF 186, CUF 186f, covers a portion of insulating layer 158 outside the footprint of semiconductor die 124. Dispenser 180 is placed in fluid communication with channel 172 and CUF 186 is deposited in channel 172. CUF 186 flows within channel 172 parallel to edge 230 and along directions 200 and 204. Dispenser 180 can be moved around channel 172 or held stationary to control the flow of CUF 186 within channel 172.

Thus, CUF 186 is deposited within area 184 between semiconductor die 124 and substrate 162, and within channel 172, from each side 196, 210, 220, and 230 of semiconductor die 124. CUF 186 is distributed evenly under semiconductor die 124 and around semiconductor die 124 within channel 172. CUF 186a is distributed evenly within area 184 between semiconductor die 124 and substrate 162. A portion of CUF 186, CUF 186b, is deposited over insulating layer 158 outside the footprint of semiconductor die 124 as dispenser 180 is moved away from edge 196 of semiconductor die 124. A portion of CUF 186, CUF 186d, is deposited over insulating layer 158 outside the footprint of semiconductor die 124 as dispenser 180 is moved away from edge 210 of semiconductor die 124. A portion of CUF 186, CUF 186e, is deposited over insulating layer 158 outside the footprint of semiconductor die 124 as dispenser 180 is moved away from edge 220 of semiconductor die 124. A portion of CUF 186, CUF 186f, is deposited over insulating layer 158 outside the footprint of semiconductor die 124 as dispenser 180 is moved away from edge 230 of semiconductor die 124. CUF 186c is deposited within channel 172 around semiconductor die 124. CUF 186 is stronger and more durable than insulating layer 158, and depositing CUF 186 in channel 172 provides additional structural support to substrate 162 and reduces warpage of substrate 162 without adding significant weight or volume to the package. Additionally, CUF 186 has a lower CTE than insulating layer 158, and provides structural support to substrate 162 and reduces warpage of substrate 162 under thermal stress. Because CUF 186 is deposited within channel 172 during the same processing phase of depositing CUF 186 under semiconductor die 124, CUF 186 provides additional structural support to substrate 162 without significantly increasing the manufacturing time or cost of the package. Additionally, depositing CUF 186 between semiconductor die 124 and substrate 162 and within channel 172 from each edge 196, 210, 220, and 230 of semiconductor die 124 provides more even distribution of CUF 186 within a footprint of semiconductor die 124 and within channel 172 and reduces voids in CUF 186.

Figure 8D:
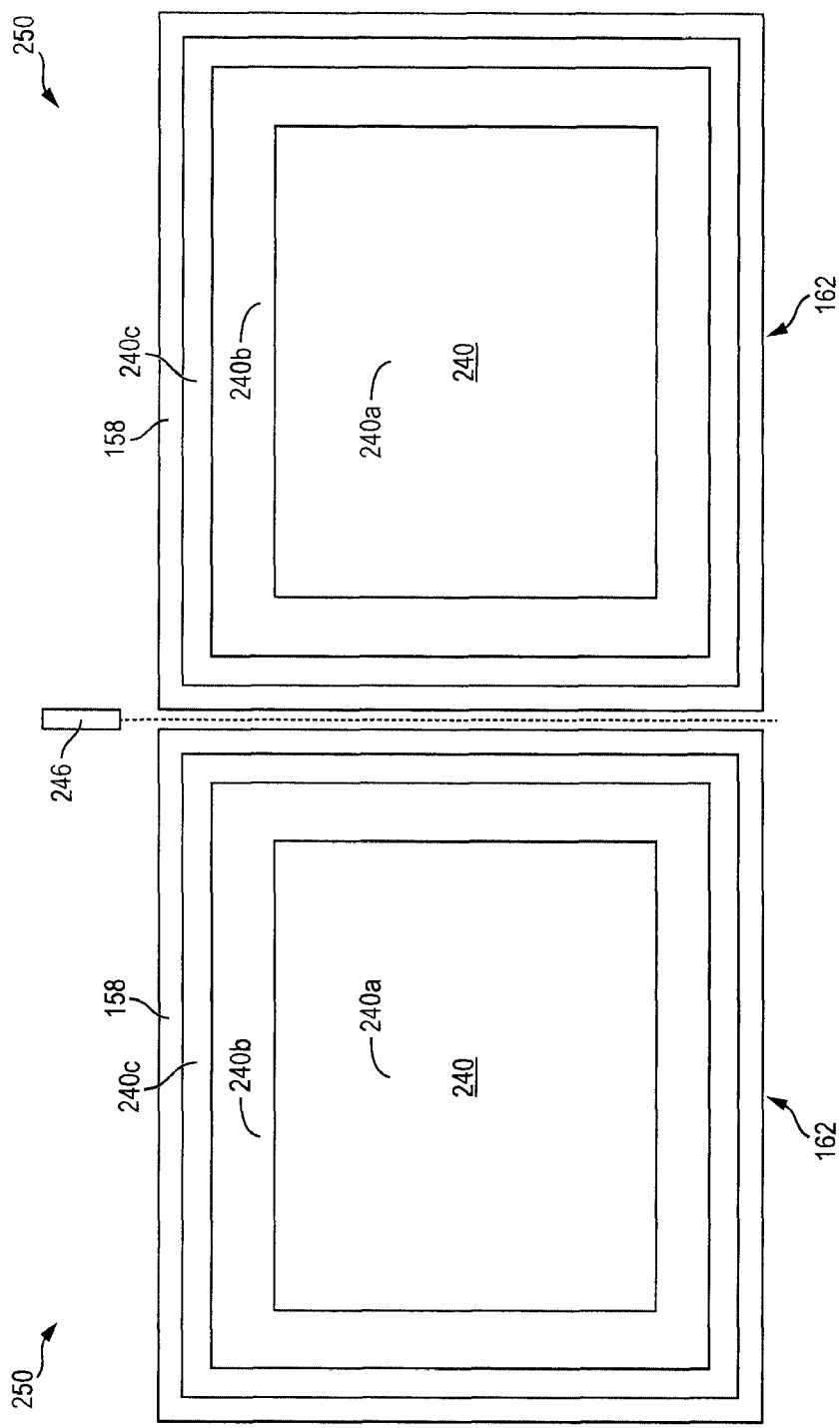

FIGS. 8a-8e illustrate a process of mounting a heat spreader or heat sink over a semiconductor die. Continuing from FIG. 5g, FIG. 8a shows a cross-sectional view of semiconductor die 124 and substrate 162 after depositing CUF 186 between semiconductor die 124 and substrate 162 and within channel 172 around semiconductor die 124. A thermal interface material (TIM) 234 is deposited over back surface 128 of semiconductor die 124. TIM 234 is a thermal epoxy, thermal epoxy resin, or thermal conductive paste.

An electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 236. In some applications, bumps 236 are reflowed a second time to improve electrical contact to conductive layer 160. Bumps 236 can also be compression bonded to conductive layer 160. An optional under bump metallization (UBM) layer can be formed over conductive layer 160. Bumps 236 represent one type of interconnect structure that can be formed over conductive layer 160. The interconnect structure can also use stud bump, micro bump, or other electrical interconnect.

In FIG. 8b, a heat spreader or heat sink 240 is positioned over and mounted to TIM 234 and bumps 236 over semiconductor die 124, substrate 162, channel 172, and CUF 186. Heat spreader 240 can be Cu, Al, or other material with high thermal conductivity. Heat spreader 240 has a horizontal portion 240a contacting TIM 234 and covering semiconductor die 124, channel 172, and CUF 186. Horizontal portion 240a extends laterally across substrate 162, parallel to substrate 162. Heat spreader 240 has a leg portion 240b extending vertically or angled with respect to horizontal portion 240a to horizontal portion 240c. Horizontal portion 240c mechanically and electrically connects heat spreader 240 to substrate 162 through bumps 236 and conductive layers 150, 160, and vias 146.

FIG. 8c shows heat spreader 240 mounted to substrate 162 and TIM 234 over semiconductor die 124 and CUF 186 within channel 172. Heat spreader 240 and TIM 234 form a thermally conductive path that distributes and dissipates the heat generated by the high frequency electronic components of semiconductor die 124 and increases the thermal performance of the semiconductor package. The heat is dissipated away from semiconductor die 124 through the horizontal portion 240a and down leg portion 240b to horizontal portion 240c of heat spreader 240 to bumps 236 and conductive layer 160.

An electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 244. In some applications, bumps 244 are reflowed a second time to improve electrical contact to conductive layer 160. An optional under bump metallization (UBM) layer can be formed over conductive layer 160.

Bumps 244 can also be compression bonded or thermocompression bonded to conductive layer 150. In one embodiment, thermocompression bonding is used to bond Au bumps by applying 30 MPa of pressure at 300° C. for 2 minutes. Bumps 244 represent one type of interconnect structure that can be formed over conductive layer 150. The interconnect structure can also use stud bump, micro bump, conductive column, composite bumps with a fusible and non-fusible portion, or other electrical interconnect. The assembly is singulated through substrate 162 with saw blade or laser cutting tool 246 into individual semiconductor packages 250.

The size of semiconductor die 124 can vary according to the design and function of semiconductor die 124, and can have a relatively large footprint. In one embodiment, semiconductor die 124 is 22 millimeters (mm) across one edge and 18 mm across a perpendicular edge. Similarly, the size of substrate 162 can vary according to the design and function of semiconductor die 124, and can have a relatively large footprint in order to accommodate the size of semiconductor die 124 and provide for sufficient heat dissipation and electrical interconnection from semiconductor die 124. In one embodiment, substrate 162 is 55 mm across one edge and 55 mm across a perpendicular edge, after singulation. Thus, the distance or gap between the peripheral edge or perimeter of semiconductor die 124 and the peripheral edge or perimeter of substrate 162 can be relatively large making substrate 162 prone to warpage under thermal and mechanical stress. In one embodiment, the distance between the perimeter of semiconductor die 124 and the perimeter of substrate 162 is approximately 15 mm. Depositing CUF 186 in channel 172 around semiconductor die 124 provides additional structural support to substrate 162 without adding significant volume to semiconductor package 250. Additionally, because CUF 186 is deposited in channel 172 during the same processing phase of depositing CUF 186 between semiconductor die 124 and substrate 162, CUF 186 provides additional structural support to substrate 162 without significantly increased manufacturing time or cost.

FIG. 8d shows a top or plan view of heat spreader 240 mounted over substrate 162 and semiconductor die 124. Horizontal portion 240a extends laterally across substrate 162, parallel to substrate 162 over semiconductor die 124. Leg portion 240b of heat spreader 240 extends vertically or angled with respect to horizontal portion 240a around each edge of semiconductor die 124. The assembly is singulated through substrate 162 with saw blade or laser cutting tool 246 into individual semiconductor packages 250.

Figure 8E:
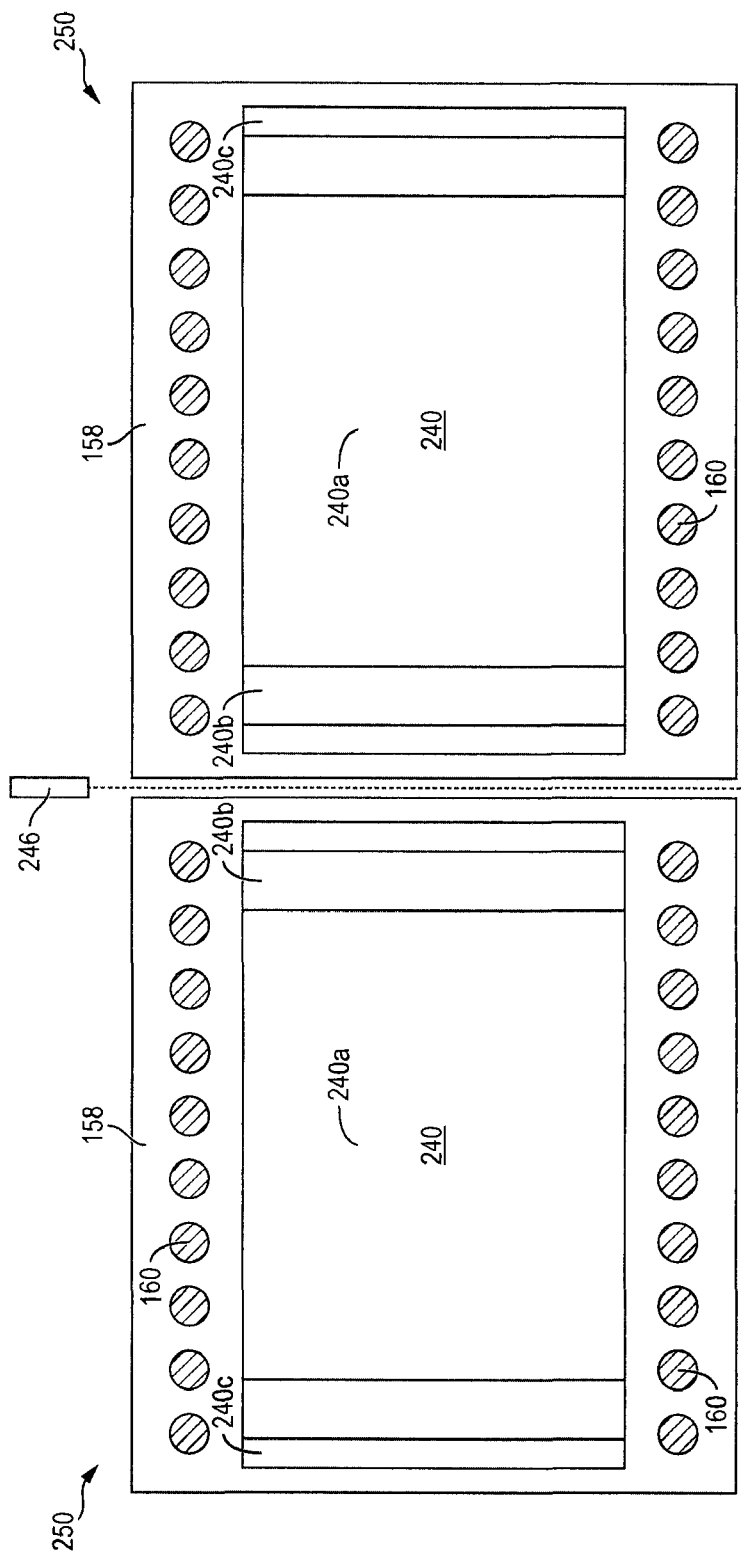

FIG. 8e shows an alternative embodiment in which leg portion 240b of heat spreader 240 does not extend vertically or angled with respect to horizontal portion 240a around each edge of semiconductor die 124. Rather, leg portion 240b only extends down to 240c to electrically and mechanically connect heat spreader 240 to substrate 162 along two edges of semiconductor die 124. Conductive layer 160 remains exposed along the other two edges of semiconductor die 124 for electrical interconnect with additional components. The assembly is singulated through substrate 162 with saw blade or laser cutting tool 246 into individual semiconductor packages 250.

Figure 9:
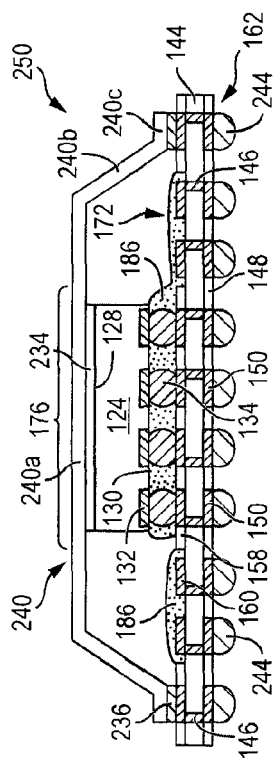
FIG. 9 illustrates a semiconductor die mounted over a substrate with a channel formed around the semiconductor die and an underfill material deposited in the channel.

FIG. 9 shows semiconductor package 250 after singulation. Semiconductor die 124 is electrically connected to substrate 162 with bumps 134. A portion of insulating layer 158 around semiconductor die 124 is removed to form channel 172 around semiconductor die 124. CUF 186 is deposited between semiconductor die 124 and substrate 162 and within channel 172.

A plurality of bumps 244 are formed over conductive layer 150 for vertical electrical interconnect with substrate 162 and semiconductor die 124 with additional components. Additionally, a heat spreader 240 is mounted over semiconductor die 124 and substrate 162 using TIM 234. Heat spreader 240 and TIM 234 form a thermally conductive path that distributes and dissipates the heat generated by the high frequency electronic components of semiconductor die 124 and increases thermal performance of semiconductor package 250. Heat spreader 240 has a horizontal portion 240*a* mounted to TIM 234 over semiconductor die 124 and substrate 162 and extending across substrate 162. Heat spreader 240 has leg portion 240*b* extending vertically or angled with respect to horizontal portion 240*a* to mechanically and electrically connect heat spreader 240 to substrate 162 with horizontal portion 240*c*. Leg portion 240*b* can extend from horizontal portion 240*a* around each edge of semiconductor die 124, or can leave one or more edges of semiconductor die 124 exposed to provide additional air flow around semiconductor die 124.

The size of semiconductor die 124 can vary according to the design and function of semiconductor die 124, and can have a relatively large footprint. Similarly, the size of substrate 162 can vary according to the design and function of semiconductor die 124, and can have a relatively large footprint in order to accommodate the size of semiconductor die 124 and provide for sufficient heat dissipation from semiconductor die 124. Thus, the distance or gap between the peripheral edge or perimeter of semiconductor die 124 and the peripheral edge or perimeter of substrate 162 can be relatively large making substrate 162 prone to warpage under thermal and mechanical stress. Depositing CUF 186 in channel 172 around semiconductor die 124 provides additional structural support to substrate 162 without adding significant volume to semiconductor package 250. Additionally, because CUF 186 is deposited in channel 172 during the same processing phase of depositing CUF 186 between semiconductor die 124 and substrate 162, CUF 186 provides additional structural support to substrate 162 without significantly increased manufacturing time or cost.

Figure 10:
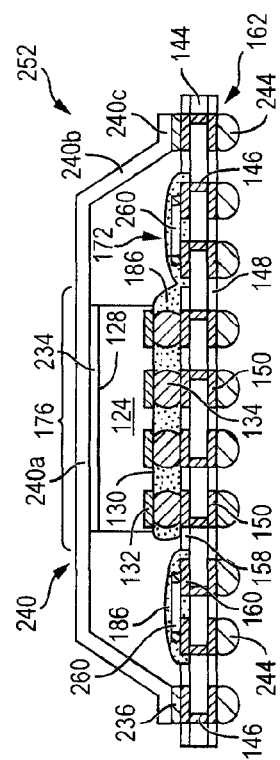
FIG. 10 illustrates a semiconductor package with passive components mounted in a channel formed around a semiconductor die.

FIG. 10 shows semiconductor package 252, similar to the embodiment shown in FIG. 9, with discrete electrical device or passive component 260 mounted over and electrically connected to conductive layer 160 within channel 172. Discrete electrical device 260 can be any discrete or passive electrical component, such as an inductor, capacitor, resistor, transistor, or diode, according to the design and function of semiconductor die 124. Discrete electrical device 260 is mounted within channel 172 to reduce the footprint of the components within semiconductor package 252. CUF 186 is formed over discrete electrical device 260 within channel 172 to provide additional structural support to substrate 162 and to environmentally protect the discrete electrical device 260 from external elements and contaminants.

The size of semiconductor die 124 can vary according to the design and function of semiconductor die 124, and can have a relatively large footprint. Similarly, the size of substrate 162 can vary according to the design and function of semiconductor die 124, and can have a relatively large footprint in order to accommodate the size of semiconductor die 124 and provide for sufficient heat dissipation from semiconductor die 124. Thus, the distance or gap between the peripheral edge or perimeter of semiconductor die 124 and the peripheral edge or perimeter of substrate 162 can be relatively large making substrate 162 prone to warpage under thermal and mechanical stress. Depositing CUF 186 in channel 172 around semiconductor die 124 provides additional structural support to substrate 162 without adding significant volume to semiconductor package 252. Additionally, because CUF 186 is deposited in channel 172 during the same processing phase of depositing CUF 186 between semiconductor die 124 and substrate 162, CUF 186 provides additional structural support to substrate 162 without significantly increased manufacturing time or cost.

Figure 11A:
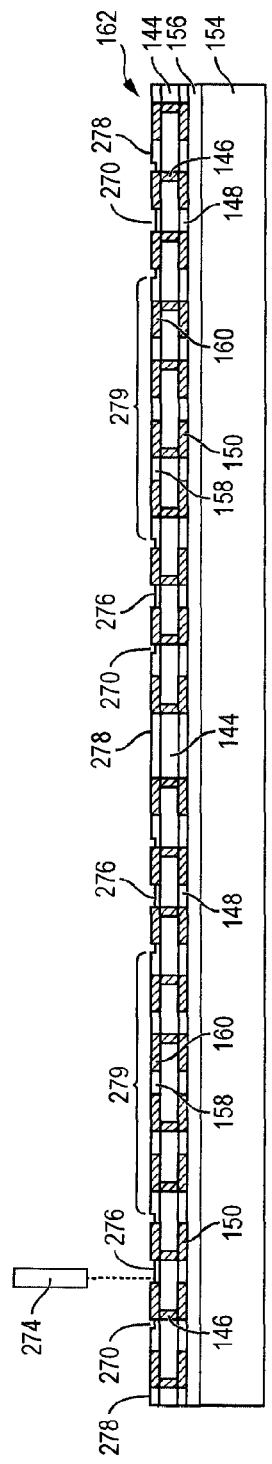
FIGS. 11a-11c illustrate a process of forming a channel or groove partially through an insulating layer.
Figure 11B:
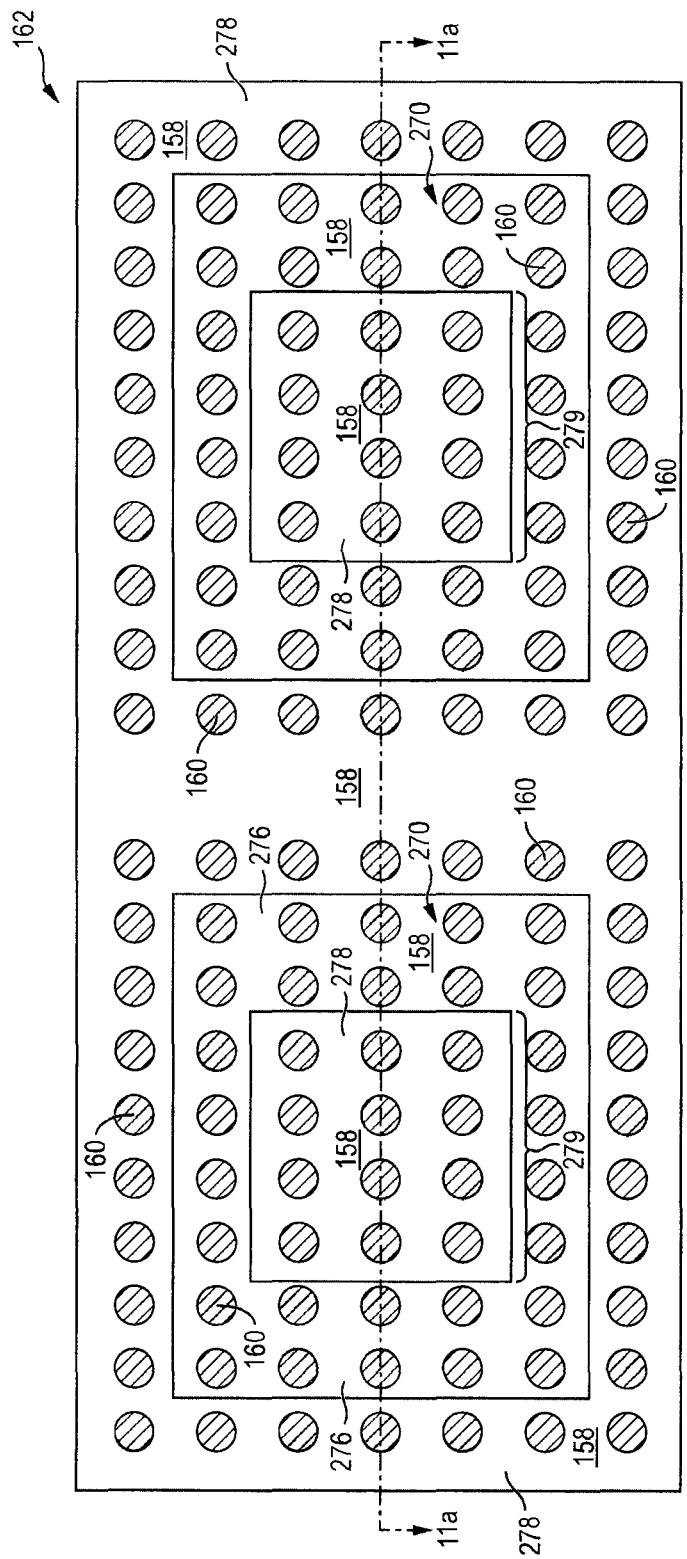
Figure 11C:
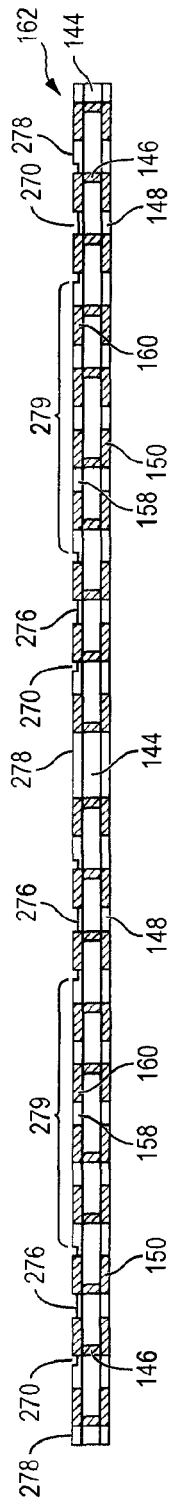

FIGS. 11*a*-11*c* illustrate, in relation to FIGS. 1 and 2*a*-2*c*, a process of forming a channel or groove partially through an insulating layer. Continuing from FIG. 4*c*, a portion of insulating layer 158 is removed by an etching process using a patterned photoresist layer to form a channel or groove 270 around semiconductor die 124, as shown in FIG. 11*a*. Alternatively, a portion of insulating layer 158 is removed by LDA using laser 274 to form channel 270. Channel 270 extends partially through insulating layer 158 to expose surface 276 of insulating layer 158. Surface 276 of insulating layer 158 is recessed or vertically offset with respect to exposed surface 278 of insulating layer 158. Insulating layer 158 maintains coverage over substrate 144 within channel 270. Forming channel 270 only partially through insulating layer 158, while allowing insulating layer 158 to maintain coverage over substrate 144 within channel 270, allows subsequently deposited underfill material to be formed in channel 270 while avoiding reduced shear strength between substrate 144 and the underfill material. The removal of insulating layer 158 does not remove conductive layer 160. The formation of channel 270 leaves conductive layer 160 intact for electrical interconnect. A central region 279 of insulating material 158, interior to channel 270, is not removed and insulating material 158 maintains coverage over substrate 144 within central region 279.

FIG. 11*b* shows a top or plan view of the assembly from FIG. 11*b*. Channel 270 extends partially through insulating layer 158 to expose surface 276 of insulating layer 158. Surface 276 of insulating layer 158 is exposed where insulating layer 158 is removed. Surface 276 of insulating layer 158 is recessed or vertically offset with respect to surface 278 of insulating layer 158 outside the footprint of channel 270. Channel 270 is formed with a generally square, rectangular, or box pattern or footprint, with a central region 279 of insulating layer 158, interior to channel 270, where a portion of insulating layer 158 is not removed. The shape or footprint of channel 270 can vary according to the design and function of semiconductor die 124 and can be, for example, generally circular or oval. In FIG. 11*c*, carrier 154 and interface layer 156 are removed by chemical etching, mechanical peeling, CMP, mechanical grinding, thermal bake, UV light, laser scanning, or wet stripping to expose conductive layer 150 and insulating layer 148.

Figure 12A:
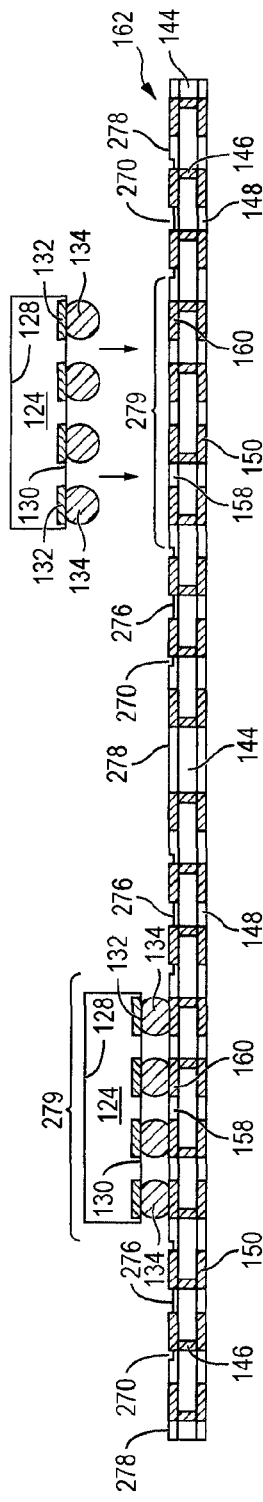

FIGS. 12*a*-12*g* illustrate, in relation to FIGS. 1 and 2*a*-2*c*, a process of mounting a semiconductor die on a substrate with a channel formed partially through an insulating layer. In FIG. 12*a*, semiconductor die 124 from FIGS. 3*a*-3*c* are positioned over and mounted to substrate 162 over central region 279 of insulating layer 158, interior to channel 270, using a pick and place operation with active surface 130 oriented toward the substrate. Bumps 134 are aligned with conductive layer 160. Semiconductor die 124 is mounted to substrate 162 by reflowing bumps 134 to electrically and metallurgically connect bumps 134 to conductive layer 160.

Figure 12B:
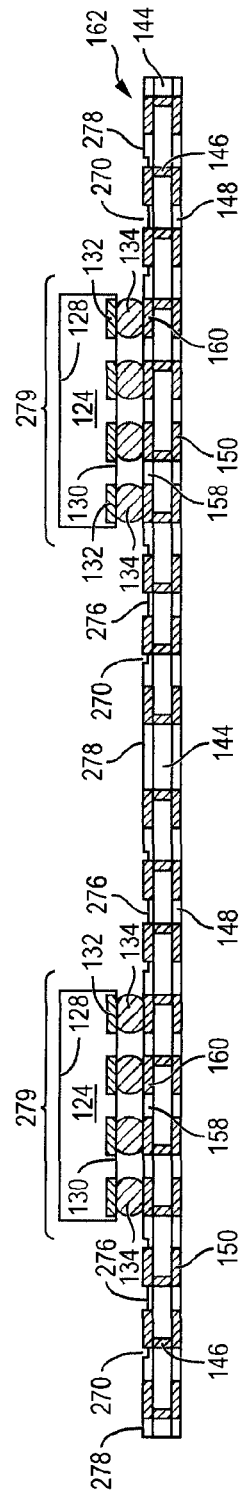

FIG. 12*b* shows semiconductor die 124 mounted over substrate 162. Bumps 134 are electrically connected to conductive layers 160 and 150 and conductive vias 146 according to the electrical design and function of semiconductor die 124. The circuits on active surface 130 of semiconductor die 124 are electrically connected through conductive layer 132 and bumps 134 to conductive vias 146 and conductive layers 150 and 160.

FIG. 12*c* shows a top or plan view of the assembly from FIG. 12*b*. Channel 270 extends partially through insulating layer 158 to expose surface 276 of insulating layer 158. Surface 276 is vertically offset or recessed with respect to surface 278 of insulating layer 158 outside the footprint of channel 270. Semiconductor die 124 is mounted over substrate 162 and central region 279 of insulating layer 158 outside the footprint of channel 270. Channel 270 surrounds the perimeter of semiconductor die 124 outside the footprint of semiconductor die 124. Channel 270 is laterally offset from the footprint of semiconductor die 124 and is formed as a ring surrounding semiconductor die 124 with a generally square, rectangular, or box pattern or footprint. A central region 279 of insulating layer 158 interior to channel 270 is not removed. The shape or footprint of channel 270 can vary according to the design and function of semiconductor die 124 and can be, for example, generally circular or oval.

FIG. 12*d* shows an underfill dispenser 280 placed in fluid communication with area 284 between semiconductor die 124 and substrate 162. A CUF or encapsulant material 286 is injected under pressure from outlet 290 of dispenser 280 into area 284 between semiconductor die 124 and substrate 162 around bumps 134. CUF 286 can be polymer composite material, such as epoxy resin with filler, epoxy acrylate with filler, or polymer with proper filler. CUF 286 is non-conductive and environmentally protects the semiconductor device from external elements and contaminants.

Figure 12E:
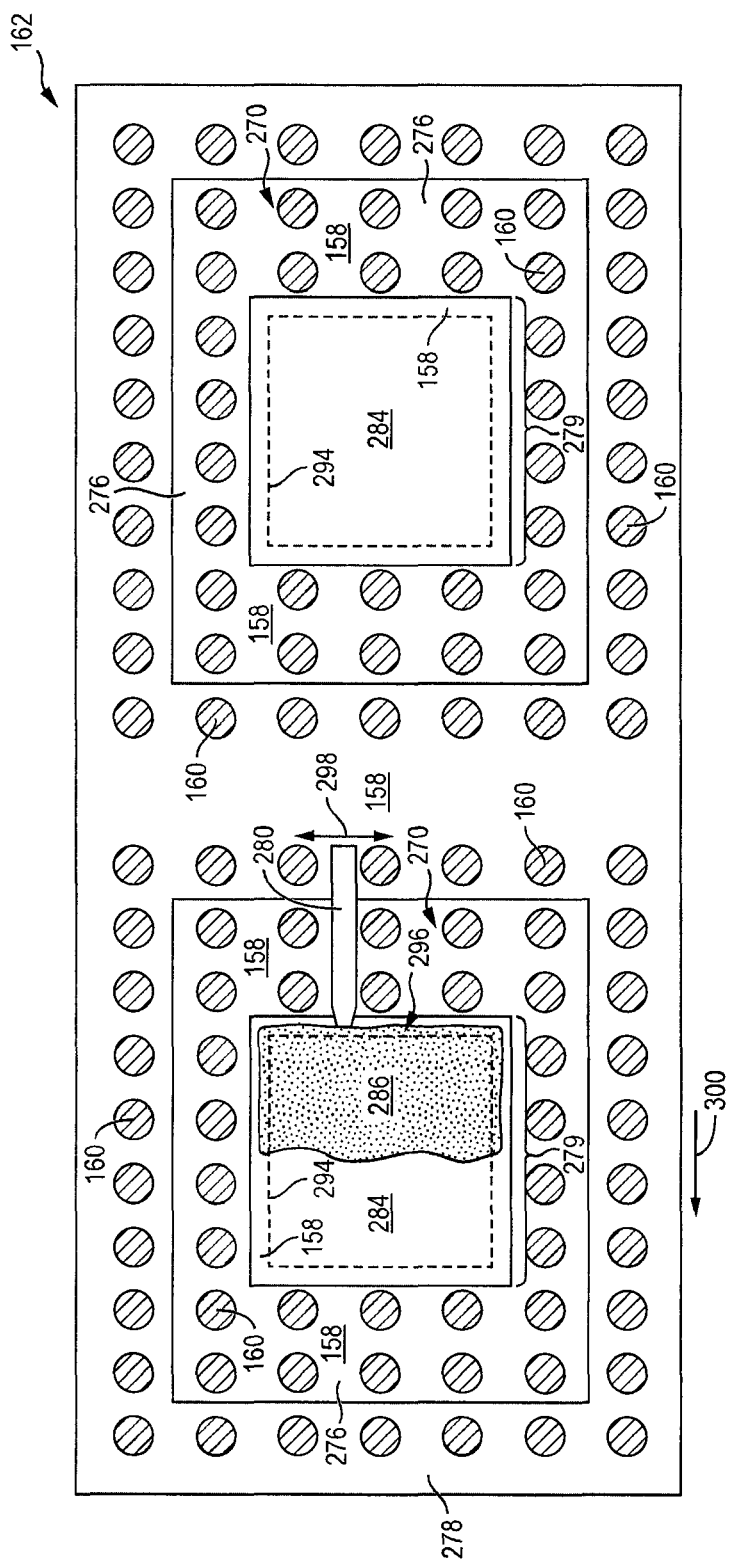

FIG. 12*e* shows a plan view of CUF 286 filling area 284 between semiconductor die 124 and substrate 162 within semiconductor die footprint or semiconductor die site 294. Dispenser 280 moves back and forth along a single edge 296 of semiconductor die 124 to inject CUF 286 into area 284 under pressure, as shown by arrows 298. As dispenser 280 moves back and forth along edge 296 of semiconductor die 124, CUF 286 is distributed evenly within area 284 and flows under semiconductor die 124 and around bumps 134 in direction 300, perpendicular to edge 296 of semiconductor die 124. A portion of CUF 286 flows or bleeds outside semiconductor die site 294 and extends outside the footprint of semiconductor die 124. The distribution of CUF 286 can be controlled by adjusting the rate of motion of dispenser 280 and the flow rate of CUF 286, to reduce bleed-out of excess CUF 286 outside the footprint of semiconductor die 124.

Figure 12F:
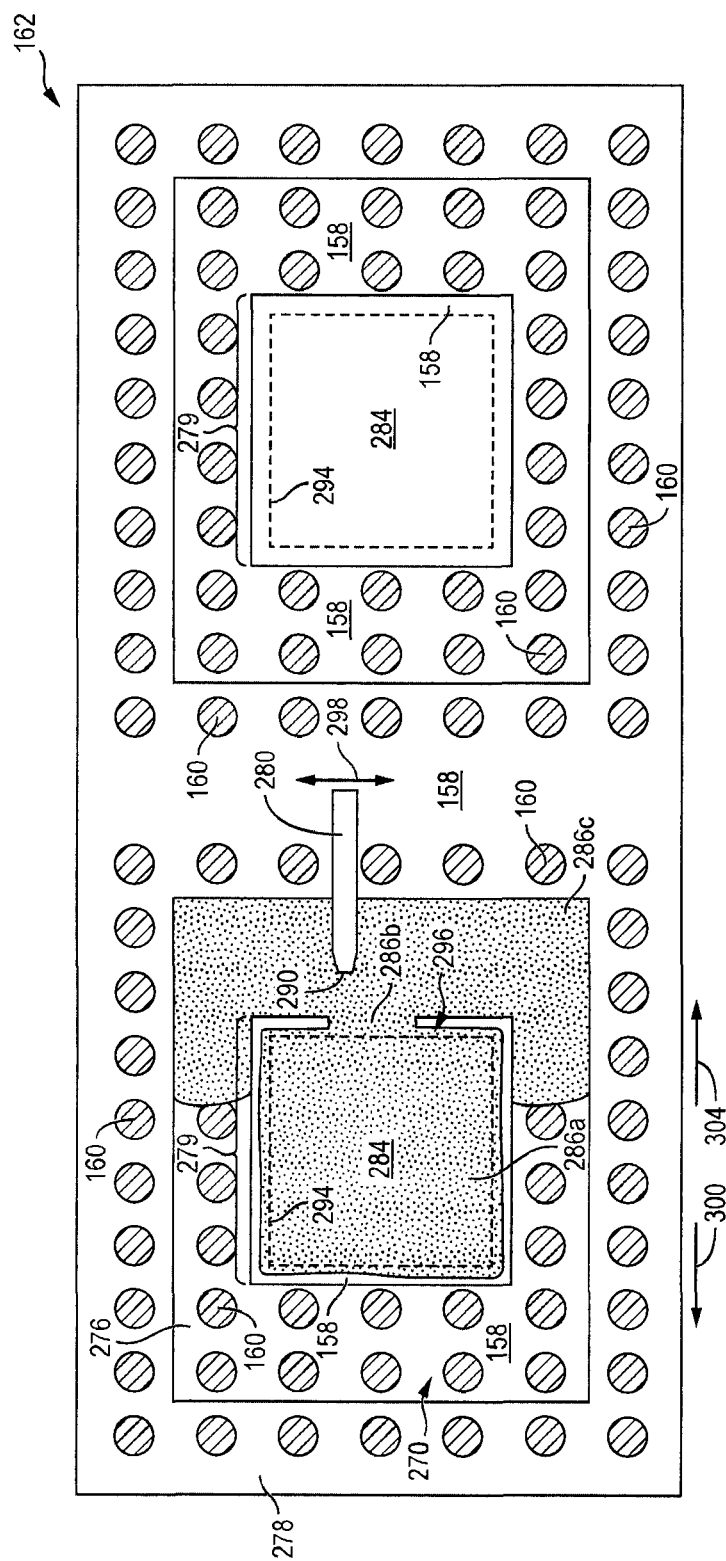

FIG. 12*f* shows the assembly after a portion of CUF 286, CUF 286*a*, completely fills area 284 between semiconductor die 124 and substrate 162. Dispenser 280 is moved away from edge 296 of semiconductor die 124 in direction 304, opposite from direction 300 and perpendicular to edge 296. As dispenser 280 is moved away from edge 296 of semiconductor die 124, a portion of CUF 286, CUF 286*b*, covers a portion of insulating layer 158 outside the footprint of semiconductor die 124. Dispenser 280 is placed in fluid communication with channel 270 and CUF 286 is deposited in channel 270. CUF 286 flows within channel 270 parallel to edge 296 of semiconductor die 124, and along direction 300. Dispenser 280 can be moved around channel 270 or held stationary to control the flow of CUF 286 within channel 270.

Figure 12G:
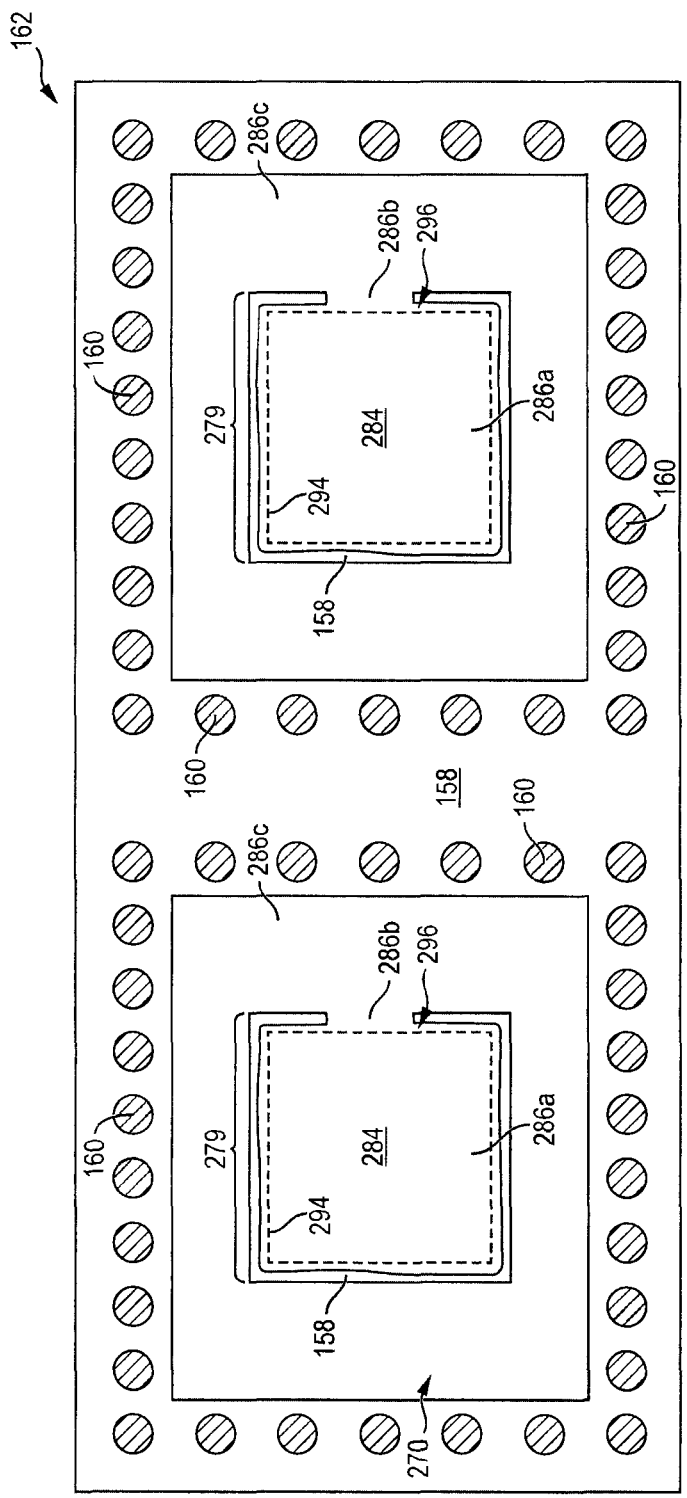

FIG. 12*g* shows CUF 286 deposited in channel 270 around semiconductor die 124 and between semiconductor die 124 and substrate 162 within a footprint of semiconductor die 124. CUF 286 is distributed evenly under semiconductor die 124 and around semiconductor die 124 within channel 270. CUF 286*a* is distributed evenly within area 284 between semiconductor die 124 and substrate 162. A portion of CUF 286, 286*b*, is deposited over insulating layer 158 outside the footprint of semiconductor die 124 as dispenser 280 is moved away from edge 296 of semiconductor die 124. CUF 286*c* is deposited within channel 270 around semiconductor die 124. CUF 286 is stronger and more durable than insulating layer 158, and depositing CUF 286 in channel 172 provides additional structural support to substrate 162 and reduces warpage of substrate 162 without adding significant weight or volume to the package. Additionally, CUF 286 has a lower CTE than insulating layer 158, and provides structural support to substrate 162 and reduces warpage of substrate 162 under thermal stress. Because CUF 286 is deposited within channel 270 during the same processing phase of depositing CUF 286 under semiconductor die 124, CUF 286 provides additional structural support to substrate 162 without significantly increasing the manufacturing time or cost of the package. Because channel 270 is formed only partially through insulating layer 158, insulating layer 158 maintains coverage over substrate 144, which allows CUF 286 to be formed in channel 270 while simultaneously avoiding reduced shear strength between substrate 144 and CUF 286.

Figure 13A:
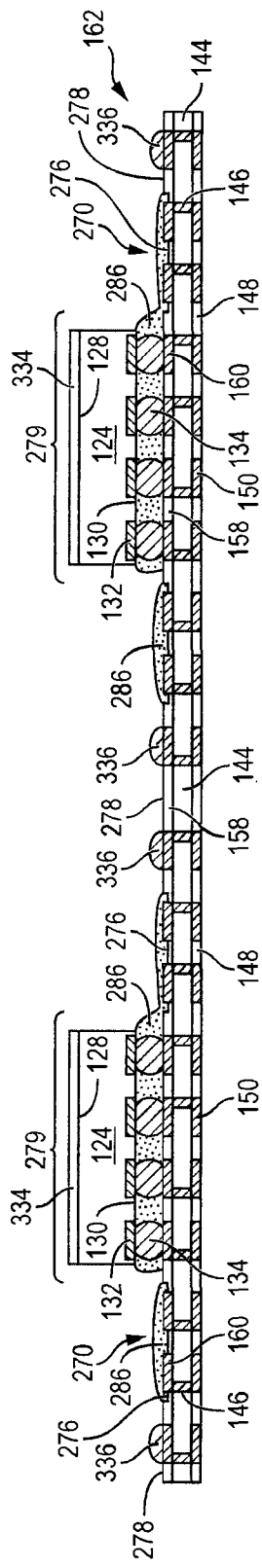
FIGS. 13a-13c illustrate a process of mounting a heat spreader or heat sink over a semiconductor die.
Figure 13B:
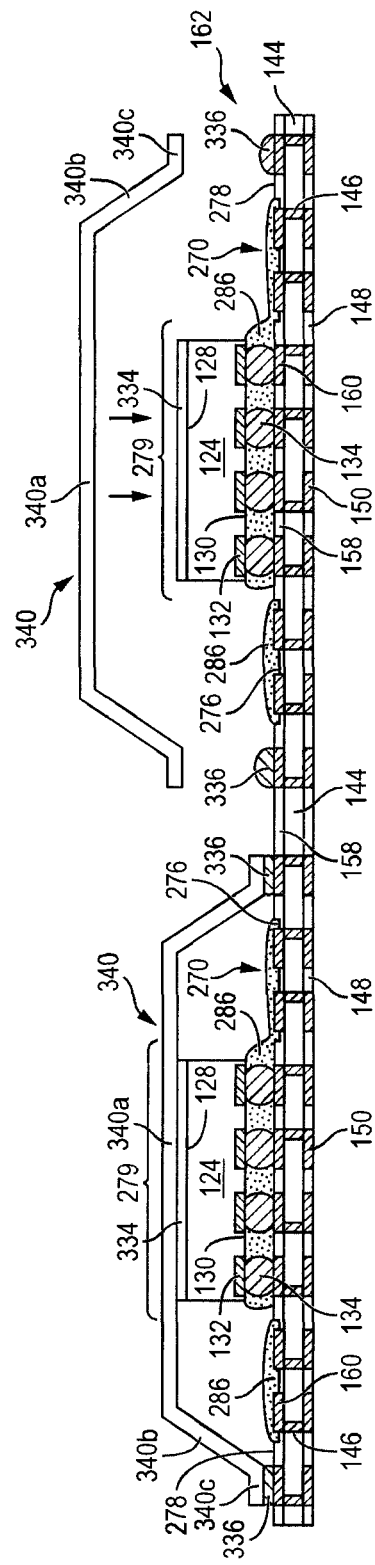
Figure 13C:
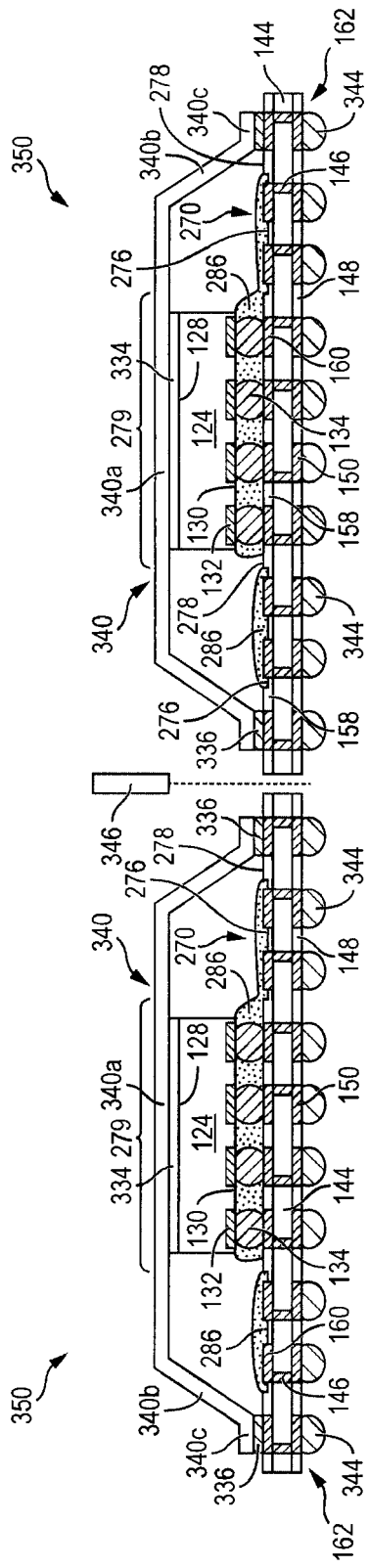

FIGS. 13*a*-13*c* illustrate a process of mounting a heat spreader or heat sink over a semiconductor die. Continuing from FIG. 12*g*, FIG. 13*a* shows a cross-sectional view of semiconductor die 124 and substrate 162 after depositing CUF 286 between semiconductor die 124 and substrate 162 and within channel 270 around semiconductor die 124. Channel 270 extends only partially through insulating layer 158 such that surface 276 of insulating layer 158 within channel 270 is recessed or vertically offset with respect to exposed surface 278 of insulating layer 158. Because channel 270 is formed only partially through insulating layer 158, insulating layer 158 maintains coverage over substrate 144, which allows CUF 286 to be formed in channel 270 while simultaneously avoiding reduced shear strength between substrate 144 and CUF 286.

TIM 334 is deposited over back surface 128 of semiconductor die 124. TIM 334 is a thermal epoxy, thermal epoxy resin, or thermal conductive paste. An electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 336. In some applications, bumps 336 are reflowed a second time to improve electrical contact to conductive layer 160. Bumps 336 can also be compression bonded to conductive layer 160. An optional UBM layer can be formed over conductive layer 160. Bumps 336 represent one type of interconnect structure that can be formed over conductive layer 160. The interconnect structure can also use stud bump, micro bump, or other electrical interconnect.

In FIG. 13*b*, a heat spreader or heat sink 340 is positioned over and mounted to TIM 334 and bumps 336 over semiconductor die 124, substrate 162, channel 270, and CUF 286. Heat spreader 240 can be Cu, Al, or other material with high thermal conductivity. Heat spreader 340 has a horizontal portion 340*a* contacting TIM 334 and covering semiconductor die 124, channel 370, and CUF 286. Horizontal portion 340*a* extends laterally across substrate 162, parallel to substrate 162. Heat spreader 340 has a leg portion 340*b* extending vertically or angled with respect to horizontal portion 340*a* to horizontal portion 340*c*. Horizontal portion 340*c* mechanically and electrically connects heat spreader 340 to substrate 162 through bumps 336 and conductive layers 150, 160, and vias 146.

FIG. 13c shows heat spreader 340 mounted to substrate 162 and TIM 334 over semiconductor die 124, with CUF 286 deposited within channel 172. Heat spreader 340 and TIM 334 form a thermally conductive path that distributes and dissipates the heat generated by the high frequency electronic components of semiconductor die 124 and increases the thermal performance of the semiconductor package. The heat is dissipated away from semiconductor die 124 through the horizontal portion 340a and down leg portion 340b to horizontal portion 340c of heat spreader 340 to bumps 336 and conductive layer 160.

An electrically conductive bump material is deposited over conductive layer 160 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 344. In some applications, bumps 344 are reflowed a second time to improve electrical contact to conductive layer 160. An optional UBM layer can be formed over conductive layer 160.

Bumps 344 can also be compression bonded or thermocompression bonded to conductive layer 150. In one embodiment, thermocompression bonding is used to bond Au bumps by applying 30 MPa of pressure at 300° C. for 2 minutes. Bumps 344 represent one type of interconnect structure that can be formed over conductive layer 150. The interconnect structure can also use stud bump, micro bump, conductive column, composite bumps with a fusible and non-fusible portion, or other electrical interconnect. The assembly is singulated through substrate 162 with saw blade or laser cutting tool 346 into individual semiconductor packages 350.

The size of semiconductor die 124 can vary according to the design and function of semiconductor die 124, and can have a relatively large footprint. Similarly, the size of substrate 162 can vary according to the design and function of semiconductor die 124, and can have a relatively large footprint in order to accommodate the size of semiconductor die 124 and provide for sufficient heat dissipation from semiconductor die 124. Thus, the distance or gap between the peripheral edge or perimeter of semiconductor die 124 and the peripheral edge or perimeter of substrate 162 can be relatively large making substrate 162 prone to warpage under thermal and mechanical stress. Depositing CUF 286 in channel 270 around semiconductor die 124 provides additional structural support to substrate 162 without adding significant volume to semiconductor package 350. Additionally, because CUF 286 is deposited in channel 270 during the same processing phase of depositing CUF 286 between semiconductor die 124 and substrate 162, CUF 286 provides additional structural support to substrate 162 without significantly increased manufacturing time or cost.

Figure 14:
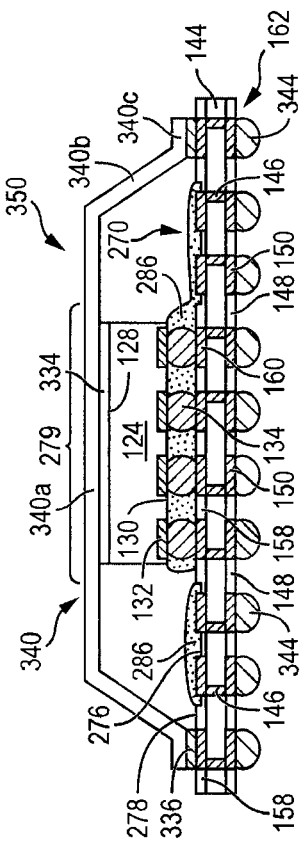
FIG. 14 illustrates a semiconductor package with a heat sink mounted over a semiconductor die and a substrate with a channel formed partially through an insulating layer.

FIG. 14 shows semiconductor package 350 after singulation. Semiconductor die 124 is electrically connected to substrate 162 with bumps 134. A portion of insulating layer 158 around semiconductor die 124 is removed to form channel 270 around semiconductor die 124. Channel 270 extends only partially through insulating layer 158 such that surface 276 of insulating layer 158 within channel 270 is recessed or vertically offset with respect to exposed surface 278 of insulating layer 158. Because channel 270 is formed only partially through insulating layer 158, insulating layer 158 maintains coverage over substrate 144 within channel 270, which allows CUF 286 to be deposited in channel 270 while simultaneously avoiding reduced shear strength between substrate 144 and CUF 286. CUF 286 provides additional structural support to substrate 162 within channel 270 to prevent warpage to substrate 162 from mechanical and thermal stress without significantly increasing the weight or volume of semiconductor package 350. Additionally, because CUF 286 is deposited in channel 270 during the same processing phase of depositing CUF 286 between semiconductor die 124 and substrate 162, CUF 286 provides additional structural support to substrate 162 without significantly increasing the manufacturing time or cost of semiconductor package 350.

A plurality of bumps 344 are formed over conductive layer 150 for vertical electrical interconnect with substrate 162 and semiconductor die 124 with additional components. Additionally, a heat spreader 340 is mounted over semiconductor die 124 and substrate 162 using TIM 334. Heat spreader 340 and TIM 334 form a thermally conductive path that distributes and dissipates the heat generated by the high frequency electronic components of semiconductor die 124 and increases thermal performance of semiconductor package 350. Heat spreader 340 has a horizontal portion 340a mounted to TIM 334 over semiconductor die 124 and substrate 162 and extending across substrate 162. Heat spreader 340 has leg portion 340b extending vertically or angled with respect to horizontal portion 340a to mechanically and electrically connect heat spreader 340 to substrate 162 with horizontal portion 340c. Leg portion 340b can extend from horizontal portion 340a around each edge of semiconductor die 124, or can leave one or more edges of semiconductor die 124 exposed to provide additional air flow around semiconductor die 124.

The size of semiconductor die 124 can vary according to the design and function of semiconductor die 124, and can have a relatively large footprint. Similarly, the size of substrate 162 can vary according to the design and function of semiconductor die 124, and can have a relatively large footprint in order to accommodate the size of semiconductor die 124 and provide for sufficient heat dissipation from semiconductor die 124. Thus, the distance or gap between the peripheral edge or perimeter of semiconductor die 124 and the peripheral edge or perimeter of substrate 162 can be relatively large making substrate 162 prone to warpage under thermal and mechanical stress. Depositing CUF 286 in channel 270 around semiconductor die 124 provides additional structural support to substrate 162 without adding significant volume to semiconductor package 350. Additionally, because CUF 286 is deposited in channel 270 during the same processing phase of depositing CUF 286 between semiconductor die 124 and substrate 162, CUF 286 provides additional structural support to substrate 162 without significantly increased manufacturing time or cost.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   forming an insulating layer over a surface of a substrate;
   forming a conductive layer completely above the surface of the substrate in the insulating layer;
   disposing a semiconductor die over the substrate with an active surface of the semiconductor die oriented toward the substrate;

forming a channel in the insulating layer extending to the surface of the substrate around the semiconductor die;
depositing an underfill material between the semiconductor die and the substrate and in the channel wherein a portion of the insulating layer between a footprint of the semiconductor die and the channel is devoid of the underfill material; and
disposing a heat spreader over the semiconductor die with the heat spreader thermally connected to the substrate.

2. The method of claim 1, further including forming a thermal interface material over the semiconductor die.

3. The method of claim 1, further including depositing the underfill material between the semiconductor die and the substrate along a first edge of the semiconductor die and along a second edge of the semiconductor die opposite the first edge.

4. The method of claim 1, further including depositing the underfill material between the semiconductor die and the substrate along a first, second, third, and fourth edge of the semiconductor die.

5. A method of making a semiconductor device, comprising:
forming an insulating layer over a surface of a substrate;
forming a conductive layer over the surface of the substrate;
disposing a semiconductor die over the substrate with an active surface of the semiconductor die oriented toward the substrate;
forming a channel in the insulating layer extending to the surface of the substrate around the semiconductor die; and
depositing an underfill material between the semiconductor die and the substrate and in the channel wherein a portion of the insulating layer between a footprint of the semiconductor die and the channel is devoid of the underfill material.

6. The method of claim 5, further including forming a thermal interface material over the semiconductor die.

7. The method of claim 5, further including disposing a heat spreader over the semiconductor die with the heat spreader thermally connected to the substrate.

8. The method of claim 5, further including depositing the underfill material between the semiconductor die and the substrate along a first edge of the semiconductor die and along a second edge of the semiconductor die opposite the first edge.

9. The method of claim 5, further including depositing the underfill material between the semiconductor die and the substrate along a first, second, third, and fourth edge of the semiconductor die.

10. A semiconductor device, comprising:
a substrate including first and second opposing surfaces;
a conductive via formed through the substrate extending from the first surface of the substrate to the second surface of the substrate;
an insulating layer formed over the first surface of the substrate;
a conductive layer formed entirely above the first surface of the substrate in the insulating layer and over the conductive via;
a semiconductor die disposed over the first surface of the substrate and contacting the conductive layer;
a channel formed in the insulating layer outside a footprint of the semiconductor die extending to the first surface of the substrate surrounding the semiconductor die;
an underfill material deposited between the semiconductor die and the substrate and in the channel wherein a portion of the insulating layer between the footprint of the semiconductor die and the channel is devoid of the underfill material; and
a heat spreader disposed over the semiconductor die with the heat spreader thermally connected to the substrate.

11. The semiconductor device of claim 10, further including a thermal interface material formed over the semiconductor die.

12. The semiconductor device of claim 10, wherein the underfill material is deposited between the semiconductor die and the substrate along a first edge of the semiconductor die and along a second edge of the semiconductor die opposite the first edge.

13. A semiconductor device, comprising:
a substrate;
an insulating layer formed over a surface of the substrate;
a conductive layer formed completely over the surface of the substrate in the insulating layer;
a semiconductor die disposed over the substrate including an active surface of the semiconductor die oriented toward the surface of the substrate;
a channel formed in the insulating layer extending to the surface of the substrate around the semiconductor die; and
an underfill material deposited between the semiconductor die and the substrate and in the channel wherein a portion of the insulating layer between a footprint of the semiconductor die and the channel is devoid of the underfill material.

14. The semiconductor device of claim 13, wherein a thermal interface material is formed over the semiconductor die.

15. The semiconductor device of claim 13, wherein the underfill material is deposited between the semiconductor die and the substrate along a first edge of the semiconductor die and along a second edge of the semiconductor die opposite the first edge.

16. The semiconductor device of claim 13, wherein the underfill material is deposited between the semiconductor die and the substrate along a first, second, third, and fourth edge of the semiconductor die.

17. A semiconductor device, comprising:
a substrate;
a semiconductor die disposed over the substrate;
an insulating layer formed over a surface of the substrate;
a channel formed in the insulating layer outside of a footprint of the semiconductor die extending to the surface of the substrate around the semiconductor die; and
an underfill material deposited between the semiconductor die and the substrate and in the channel wherein a portion of the insulating layer between the footprint of the semiconductor die and the channel is devoid of the underfill material.

18. The semiconductor device of claim 17, wherein a thermal interface material is formed over the semiconductor die.

19. The semiconductor device of claim 17, wherein the underfill material is deposited between the semiconductor die and the substrate along a first edge of the semiconductor die and along a second edge of the semiconductor die opposite the first edge.

20. The semiconductor device of claim 17, wherein the underfill material is deposited between the semiconductor die and the substrate along a first, second, third, and fourth edge of the semiconductor die.

21. The method of claim 1, further including disposing a discrete electrical device within the channel.

22. The method of claim 5, further including disposing a discrete electrical device within the channel.

23. The semiconductor device of claim 10, further including a discrete electrical device disposed within the channel.

24. The semiconductor device of claim 13, further including a discrete electrical device disposed within the channel.

25. The semiconductor device of claim 17, further including a discrete electrical device disposed within the channel.

26. The semiconductor device of claim 17, further including a heat spreader disposed over the semiconductor die with the heat spreader thermally connected to the substrate.

27. The semiconductor device of claim 13, wherein the surface of the substrate within the footprint of the semiconductor die is completely covered by the combination of the insulating layer and the conductive layer.

* * * * *